(12) United States Patent
Pan

(10) Patent No.: US 8,674,383 B2
(45) Date of Patent: Mar. 18, 2014

(54) SOLID STATE LIGHTING DEVICE ON A CONDUCTIVE SUBSTRATE

(75) Inventor: Shaoher X. Pan, Palo Alto, CA (US)

(73) Assignee: SiPhoton Inc., Palo Alto, CA (US)

( * ) Notice: Subject to any disclaimer, the term of this patent is extended or adjusted under 35 U.S.C. 154(b) by 592 days.

(21) Appl. No.: 12/691,269

(22) Filed: Jan. 21, 2010

(65) Prior Publication Data

US 2011/0175055 A1  Jul. 21, 2011

(51) Int. Cl.
*H01L 33/20* (2010.01)

(52) U.S. Cl.
USPC ............... 257/95; 257/E33.005; 257/E33.067

(58) Field of Classification Search
USPC .................. 257/14, 95, E33.005, E33.067
See application file for complete search history.

(56) References Cited

U.S. PATENT DOCUMENTS

| | | | |
|---|---|---|---|
| 4,761,681 A | 8/1988 | Reid | |
| 5,793,062 A | 8/1998 | Kish, Jr. et al. | |
| 5,838,029 A | 11/1998 | Shakuda et al. | |
| 5,854,088 A | 12/1998 | Plais et al. | |
| 5,905,275 A | 5/1999 | Nunoue et al. | |
| 6,233,265 B1 | 5/2001 | Bour | |
| 6,345,063 B1 | 2/2002 | Bour et al. | |
| 6,426,512 B1 | 7/2002 | Ito et al. | |
| 6,635,901 B2 | 10/2003 | Sawaki et al. | |
| 6,657,237 B2 | 12/2003 | Kwak et al. | |
| 6,844,569 B1 | 1/2005 | Lee et al. | |
| 6,881,981 B2 | 4/2005 | Tsuda et al. | |
| 6,936,851 B2 | 8/2005 | Wang | |
| 6,949,395 B2 | 9/2005 | Yoo | |
| 7,063,995 B2 | 6/2006 | Hata et al. | |
| 7,087,934 B2 * | 8/2006 | Oohata et al. | 257/95 |
| 7,176,480 B2 | 2/2007 | Ohtsuka et al. | |
| 7,453,093 B2 | 11/2008 | Kim et al. | |
| 7,473,571 B2 | 1/2009 | Hwang et al. | |
| 7,550,775 B2 | 6/2009 | Okuyama | |
| 7,816,156 B2 | 10/2010 | Choi et al. | |
| 7,956,370 B2 | 6/2011 | Pan | |
| 7,968,356 B2 * | 6/2011 | Kim | 438/29 |
| 7,982,205 B2 | 7/2011 | Wang | |
| 8,022,430 B2 | 9/2011 | Hata et al. | |
| 8,129,205 B2 | 3/2012 | Rana et al. | |
| 8,138,511 B2 | 3/2012 | Baur et al. | |

(Continued)

FOREIGN PATENT DOCUMENTS

CN    1638162 A    7/2005
JP    2006-045648 A    2/1994

(Continued)

OTHER PUBLICATIONS

Authorized officer Julio Maldonado, International Search Report and Written Opinion in PCT/US2011/20603, mailed Dec. 6, 2011, 11 pages.

(Continued)

*Primary Examiner* — Wensing Kuo
(74) *Attorney, Agent, or Firm* — Fish & Richardson P.C.

(57) ABSTRACT

A light emitting device includes a conductive substrate having a first substrate surface and comprising a conductive material, a protrusion formed on the conductive substrate, wherein the protrusion is defined in part by a first protrusion surface that is not parallel to the first substrate surface, and light emission layers disposed over the first protrusion surface. The light emission layers can emit light when an electric field is applied across the light emission layers.

8 Claims, 26 Drawing Sheets

(56) References Cited

U.S. PATENT DOCUMENTS

| | | |
|---|---|---|
| 8,148,744 B2 | 4/2012 | Niki et al. |
| 8,217,418 B1 | 7/2012 | Pan et al. |
| 8,304,794 B2 | 11/2012 | Pan |
| 8,313,963 B2 | 11/2012 | Pan |
| 2001/0022495 A1 | 9/2001 | Salam |
| 2001/0035580 A1 | 11/2001 | Kawai |
| 2004/0113166 A1 | 6/2004 | Tadatomo et al. |
| 2005/0145862 A1 | 7/2005 | Kim et al. |
| 2005/0179025 A1 | 8/2005 | Okuyama et al. |
| 2005/0179130 A1 | 8/2005 | Tanaka et al. |
| 2005/0199891 A1 | 9/2005 | Kunisato et al. |
| 2006/0033114 A1 | 2/2006 | Schranz |
| 2006/0169987 A1 | 8/2006 | Miura et al. |
| 2007/0073448 A1 | 3/2007 | Takubo et al. |
| 2007/0200135 A1 | 8/2007 | Wang |
| 2008/0006762 A1 | 1/2008 | Fadell et al. |
| 2008/0032439 A1 | 2/2008 | Yan et al. |
| 2008/0179611 A1 | 7/2008 | Chitnis et al. |
| 2008/0191605 A1 | 8/2008 | Lin et al. |
| 2008/0251808 A1 | 10/2008 | Kususe et al. |
| 2008/0303042 A1* | 12/2008 | Minato et al. .................. 257/98 |
| 2008/0308835 A1* | 12/2008 | Pan ............... 257/103 |
| 2009/0026486 A1 | 1/2009 | Jinushi |
| 2009/0032799 A1* | 2/2009 | Pan ................ 257/13 |
| 2009/0121250 A1 | 5/2009 | DenBaars et al. |
| 2009/0159869 A1 | 6/2009 | Ponce et al. |
| 2009/0159870 A1 | 6/2009 | Lin et al. |
| 2009/0267096 A1 | 10/2009 | Kim |
| 2009/0298212 A1 | 12/2009 | Pan |
| 2009/0325334 A1 | 12/2009 | Kwak et al. |
| 2010/0019277 A1 | 1/2010 | Hata et al. |
| 2010/0062554 A1 | 3/2010 | Kim |
| 2010/0078670 A1* | 4/2010 | Kim et al. ....... 257/98 |
| 2010/0148202 A1 | 6/2010 | Tomoda |
| 2010/0203662 A1 | 8/2010 | Pan |
| 2010/0308300 A1 | 12/2010 | Pan |
| 2011/0024722 A1 | 2/2011 | Moustakas et al. |
| 2011/0108800 A1 | 5/2011 | Pan |
| 2011/0114917 A1* | 5/2011 | Pan ............... 257/13 |
| 2011/0177636 A1* | 7/2011 | Pan et al. .......... 438/29 |
| 2011/0233581 A1 | 9/2011 | Sills et al. |
| 2012/0043525 A1 | 2/2012 | Pan |
| 2012/0205617 A1 | 8/2012 | Pan et al. |
| 2012/0241809 A1 | 9/2012 | Pan |

FOREIGN PATENT DOCUMENTS

| | | |
|---|---|---|
| JP | 2002-261327 A | 9/2002 |
| JP | 2005-064204 A | 3/2005 |
| JP | 2005-328073 A | 11/2005 |
| KR | 10-2003-0074824 A | 9/2003 |
| KR | 10-0649769 B1 | 11/2006 |
| KR | 10-0705226 B1 | 4/2007 |

OTHER PUBLICATIONS

U.S. Appl. No. 13/286,108, filed Oct. 31, 2011, Light Emitting Device, Pan.
Authorized officer Jae Hun Park, International Search Report and Written Opinion in PCT/US2008/008868, mailed Apr. 15, 2009, 13 pages.
Authorized officer Young Bae Lee, International Search Report and Written Opinion in PCT/US2008/068067, mailed Feb. 26, 2009, 12 pages.
Authorized officer Young Bae Lee, International Search Report and Written Opinion in PCT/US2010/035020, mailed Dec. 17, 2010, 14 pages.
Authorized officer Simin Baharlou, International Preliminary Report on Patentability in PCT/US2008/068067, mailed Jan. 13, 2011, 7 pages.
Authorized officer Simin Baharlou, International Preliminary Report on Patentability in PCT/US2008/008868, mailed Feb. 3, 2011, 8 pages.
Authorized officer Nora Lindner, International Preliminary Report on Patentability in PCT/US2010/035020, mailed Dec. 22, 2011, 10 pages.
Authorized officer Simin Baharlou, International Preliminary Report on Patentability in PCT/US2011/020603, mailed Aug. 2, 2012, 10 pages.
Authorized officer Simin Baharlou, International Preliminary Report on Patentability in PCT/US2012/024361, mailed Aug. 29, 2013, 5 pages.
U.S. Appl. No. 13/489,955, filed Jun. 6, 2012, Manufacturing Process for Solid State Lighting Device on a Conductive Substrate, Pan et al.
Authorized officer Hye Lyun Park, International Search Report and Written Opinion in PCT/US2012/024361, mailed Jun. 27, 2012, 8 pages.

* cited by examiner

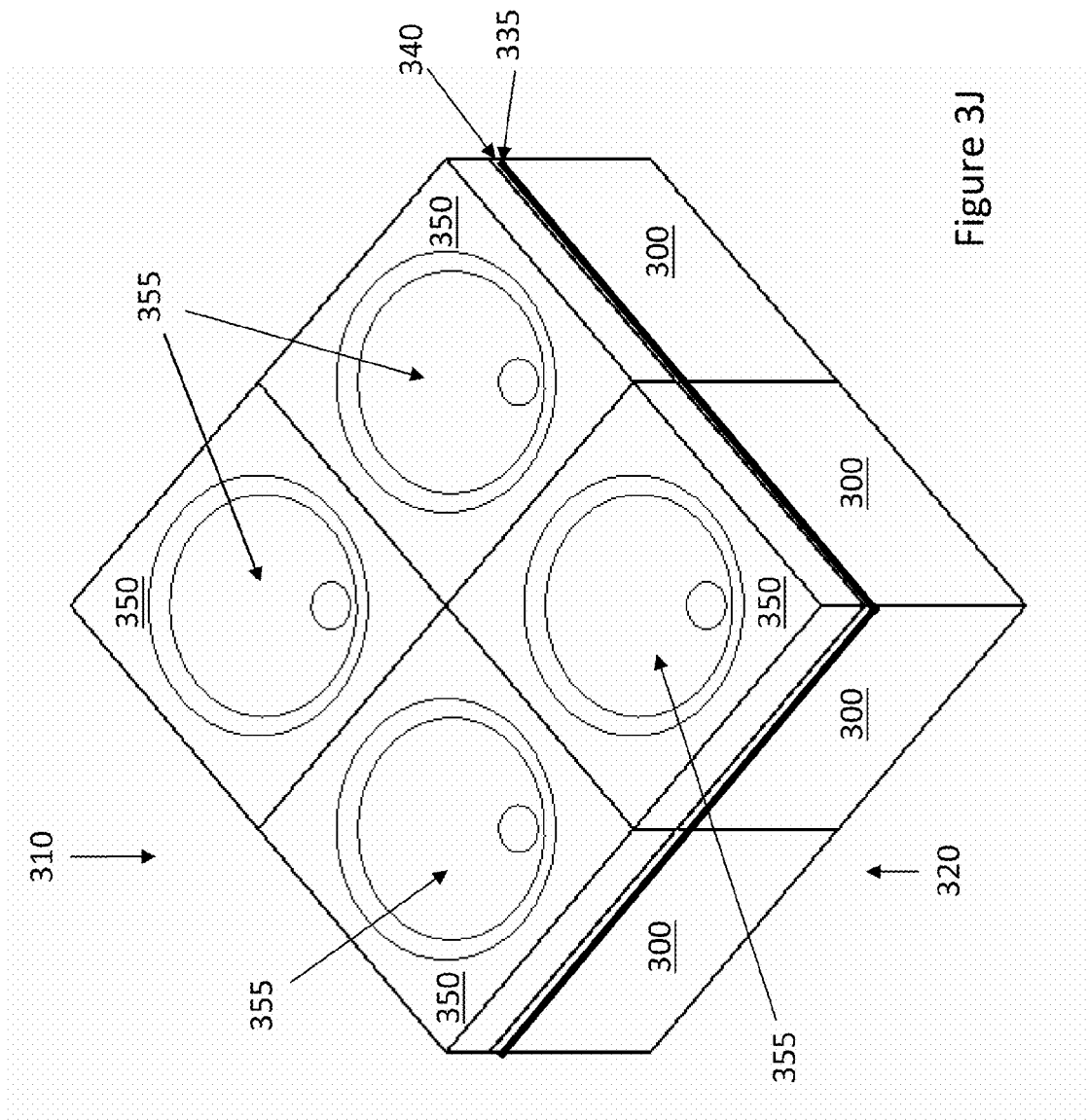

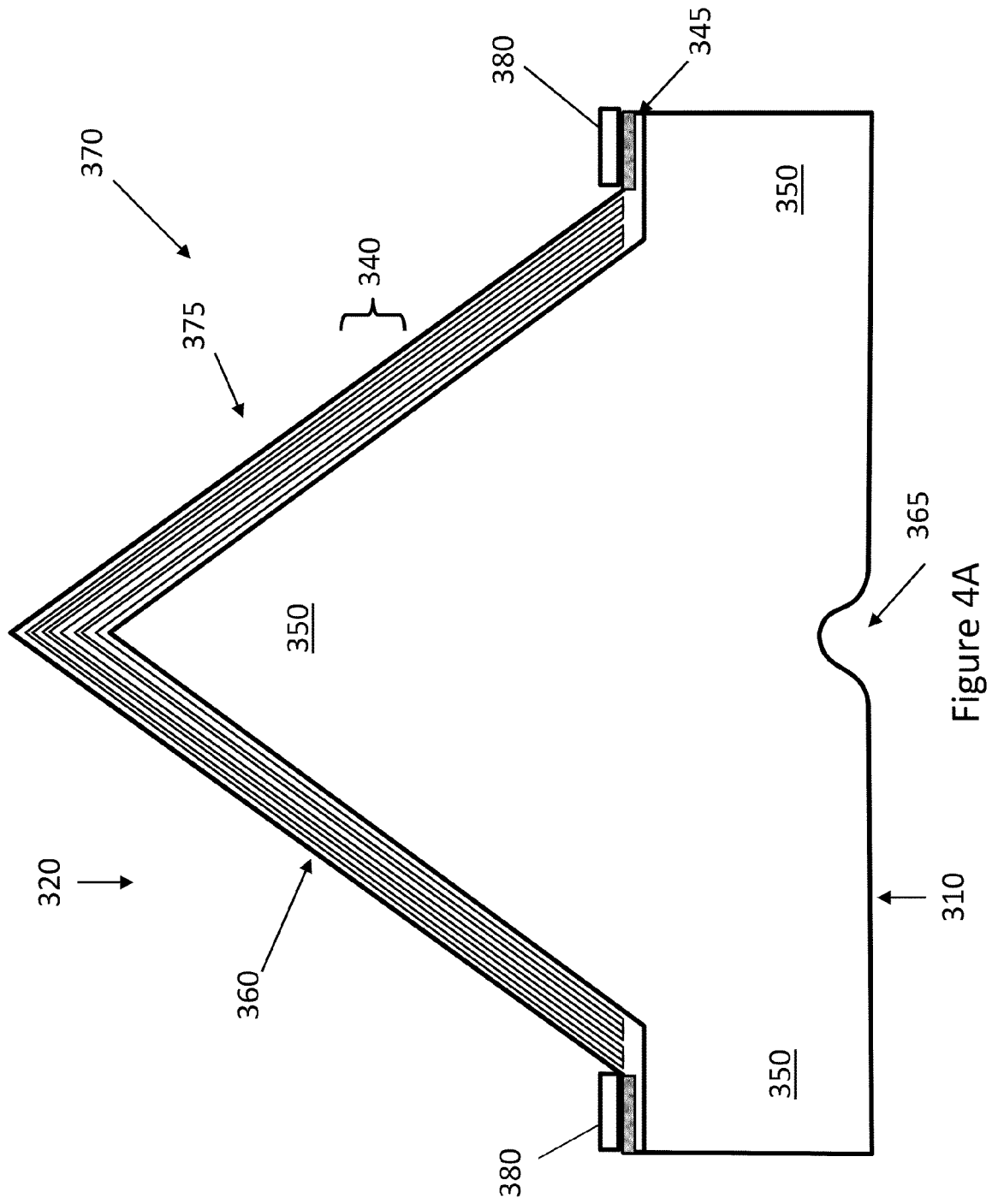

SOLID STATE LIGHTING DEVICE ON A CONDUCTIVE SUBSTRATE

BACKGROUND

The present patent application is related to solid state light emission devices.

Solid-state light sources, such as light emitting diodes (LEDs) and laser diodes, can offer significant advantages over incandescent or fluorescent lighting. The solid-state light sources are generally more efficient and produce less heat than traditional incandescent or fluorescent lights. When LEDs or laser diodes are placed in arrays of red, green and blue elements, they can act as a source for white light or as a multi-colored display. Although solid-state lighting offers certain advantages, conventional semiconductor structures and devices used for solid-state lighting are relatively expensive. The high cost of solid-state light emission devices is partially related to the relatively complex and time-consuming manufacturing process for solid-state light emission devices.

Referring to FIG. 1, a conventional LED structure 100 includes a substrate 105, which may be formed of sapphire, silicon carbide, or spinel, for example. A buffer layer 110 is formed on the substrate 105. The buffer layer 110 serves primarily as a wetting layer, to promote smooth, uniform coverage of the sapphire substrate. The buffer layer 310 is typically deposited as a thin amorphous layer using Metal Organic Chemical Vapor Deposition (MOCVD). A p-doped Group III-V compound layer 120 is formed on the buffer layer 110. The p-doped Group III-V compound layer 120 is typically made of GaN. An InGaN quantum-well layer 130 is formed on the p-doped Group III-V compound layer 120. An active Group III-V compound layer 140 is then formed on the InGaN quantum-well layer 130. An n-doped Group III-V compound layer 150 is formed on the layer 140. The p-doped Group III-V compound layer 120 is n-type doped. A p-electrode 160 (anode) is formed on the n-doped Group III-V compound layer 150. An n-electrode 170 (cathode) is formed on the first Group III-V compound layer 120.

A drawback in the conventional LED devices is that different thermal expansions between the group III-V nitride layers and the substrate can cause cracking in the group III-V nitride layers or delamination between the group III-V nitride layers from the substrate.

A factor contributing to complexity in some conventional manufacturing processes is that it requires a series of selective etch stages. For example, the cathode 170 in the conventional LED structure 100 shown in FIG. 1 is formed on the p-doped Group III-V compound layer 120 by selectively etching. These selective etch stages are complicated and time-consuming and, therefore, make the overall manufacturing process more expensive.

It is also desirable to increase active light emission intensities. The conventional LED device in FIG. 1, for example, includes non-light emission areas on the substrate 105 that are not covered by the InGaN quantum-well layer 130 to make room for the n-electrode 170. The p-electrode 160 can also block some of the emitted light from leaving the device. These design characteristics reduce the emission efficiency of the conventional LED devices.

Another requirement for LED devices is to properly direct inward-propagating light emission to the intended light illumination directions. A reflective layer is often constructed under the light emission layers to reflect light emission. One challenge associated with a metallic reflective layer is that the metals such as Aluminum have lower melting temperatures than the processing temperatures for depositing Group III-V compound layers on the metallic reflective layer. The metallic reflective layer often melts and loses reflectivity during the high temperature deposition of the Group III-V compound layers.

SUMMARY OF THE INVENTION

The disclosed light emitting device and associated manufacturing processes are intended to overcome above described drawbacks in conventional solid state lighting devices. Embodiments may include one or more of the following advantages. An advantage associated with the disclosed solid-state lighting structures and fabrication processes is that active light emitting areas and light emission efficiency can be significantly improved.

Another significant advantage associated with the disclosed solid-state lighting structures and fabrication processes is that a reflective layer can be properly formed under the light emission layers to effectively reflect the emitted light to intended light illumination directions.

Yet another significant advantage associated with the disclosed solid-state lighting structures and fabrication processes is that effective cooling can be provided by an entire conductive substrate during the lighting operation.

Moreover, the electrodes are arranged on the opposite sides of the disclosed light emission devices. Effective packaging techniques are provided without using wire bonding, which makes the packaged light emission modules more reliable and less likely to be damaged. Additionally, more than one light emission structure can be conveniently packaged in a single light emission module, which reduces packaging complexity and costs.

Furthermore, the disclosed LED structures and fabrication processes can overcome lattice mismatch between the group III-V layer and the substrate, and can prevent associated layer cracking and delamination that are found in some conventional LED structures.

In one aspect, the present invention relates to a light emitting device that includes a conductive substrate having a first substrate surface, wherein the conductive substrate includes a conductive material; a protrusion formed on the conductive substrate, wherein the protrusion canbe defined in part by a first protrusion surface that is not parallel to the first substrate surface; and light emission layers disposed over the first protrusion surface, wherein the light emission layers can emit light when an electric field is applied across the light emission layers.

Implementations of the system may include one or more of the following. The conductive material can include a metallic material or a conducting polymer. The protrusion can have the shape of a pyramid or a truncated pyramid, wherein the first substrate surface is a substantially flat face in part defining the pyramid or the truncated pyramid. The first protrusion surface can have an angle between 20 degrees and 80 degrees relative to the first substrate surface. The light emission layers can include at least one quantum well formed by Group III-V compounds. The quantum well can be formed by a first III-V nitride layer; a quantum-well layer on the first III-V nitride layer; and a second III-V nitride layer on the quantum well layer. The light emitting device can further include a reflective layer formed between the conductive substrate and the light emission layers. The reflective layer can include aluminum. The light emitting device can further include a transparent conductive layer formed over the light emission layers, wherein the electric field across the light emission layers is produced by a voltage applied between the transparent conductive layer and the conductive substrate. The light emitting device can further include an electrode layer around the protrusion, wherein the electrode layer is in electric connection with the transparent conductive layer.

In one aspect, the present invention relates to a light emitting device that includes a non-crystalline conductive substrate; and light emission layers having monolithic crystal structures disposed over the conductive substrate, wherein the light emission layers can emit light when an electric field is applied across the light emission layers.

Implementations of the system may include one or more of the following. The light emission layers can include at least one monolithic quantum well formed by Group III-V compounds. The monolithic quantum well can be formed by a first III-V nitride layer; a quantum-well layer on the first III-V nitride layer; and a second III-V nitride layer on the quantum well layer. The light emitting device can further include a reflective layer formed between the conductive substrate and the light emission layers. The light emitting device can further include a transparent conductive layer formed over the light emission layers, wherein the electric field across the light emission layers is produced by a voltage applied between the transparent conductive layer and the conductive substrate. The light emitting device can further include a protrusion formed on the conductive substrate, wherein the conductive substrate comprises a first substrate surface outside of the protrusion, wherein the protrusion is defined in part by a first protrusion surface that is not parallel to the first substrate surface. The protrusion can have the shape of a pyramid or a truncated pyramid. The non-crystalline conductive substrate can include a metallic material or a conducting polymer In another aspect, the present invention relates to a light emission module that includes a mounting substrate having a first electrode and a second electrode; one or more light emitting structures constructed on a conductive substrate, wherein each of the one or more light emitting structures comprises light emission layers and a transparent conductive layer on the light emission layers, wherein the light emission layers in each of one or more light emitting structures are configured to emit light when a voltage is applied between the transparent conductive layer and the conductive substrate; and an electric interconnect configured to clamp the one or more light emitting structures to the mounting substrate to allow the first electrode to be in electrical connection with the conductive substrate and the second electrode to be in electric connection with the transparent conductive layer.

Implementations of the system may include one or more of the following. The one or more light emitting structures can include one or more protrusions on the conductive substrate, wherein the light emission layers are formed on the one or more protrusions. The one or more light emitting structures can further include an electrode layer around the protrusion, the electrode layer in electric connection with the transparent conductive layer, wherein the electric interconnect is configured to electrically connect the electrode layer to the second electrode. The electric interconnect can include a window over the light emission layers in the one or more light emitting structures to allow light emitted from the light emission layers to pass through when the electric interconnect clamps the one or more light emitting structures to the mounting substrate.

BRIEF DESCRIPTION OF THE DRAWINGS

The following drawings, which are incorporated in and from a part of the specification, illustrate embodiments of the present invention and, together with the description, serve to explain the principles of the invention.

FIG. 4A is a detailed cross-sectional view illustrating a light emission structure with small lateral dimensions.

DESCRIPTION OF THE INVENTION

Figure 1:
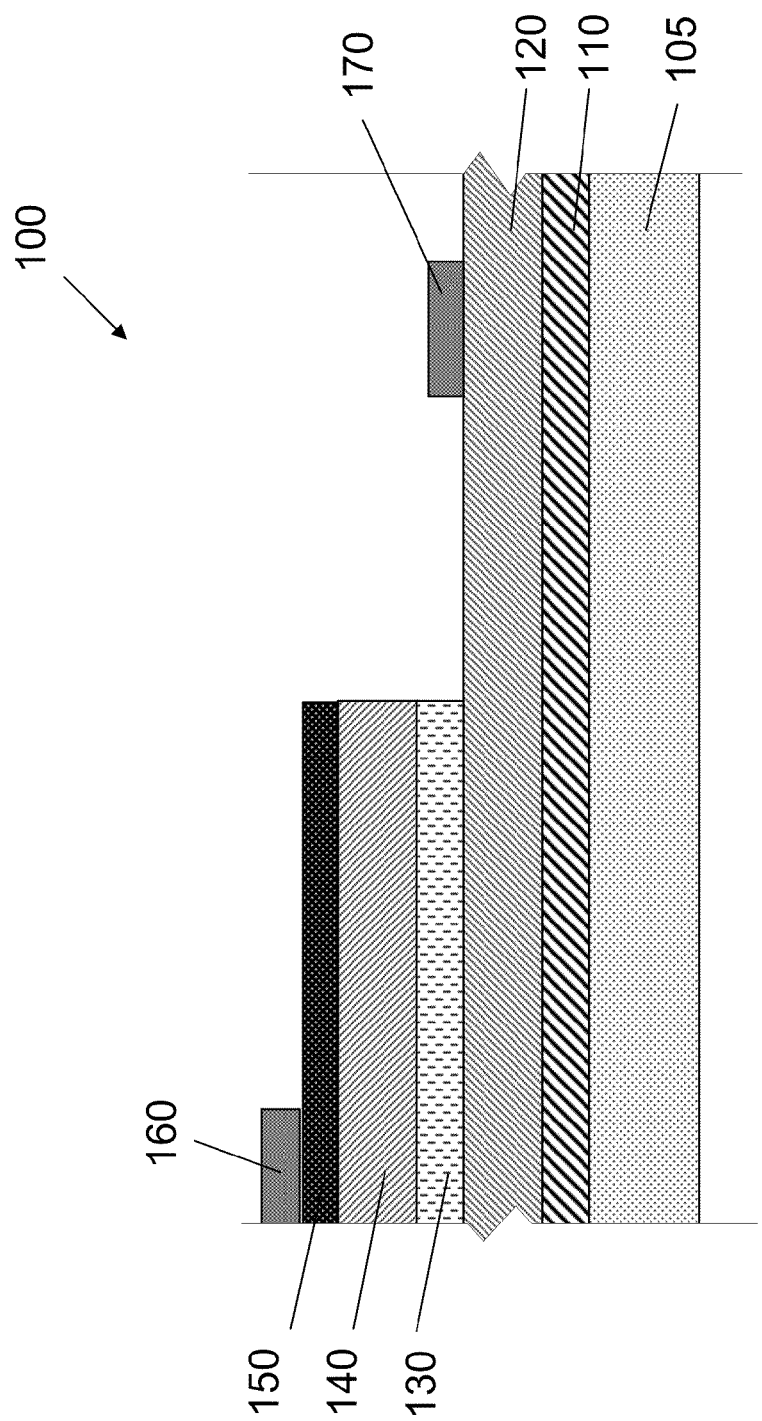
FIG. 1 is a cross-sectional view of a conventional LED structure.
Figure 2:
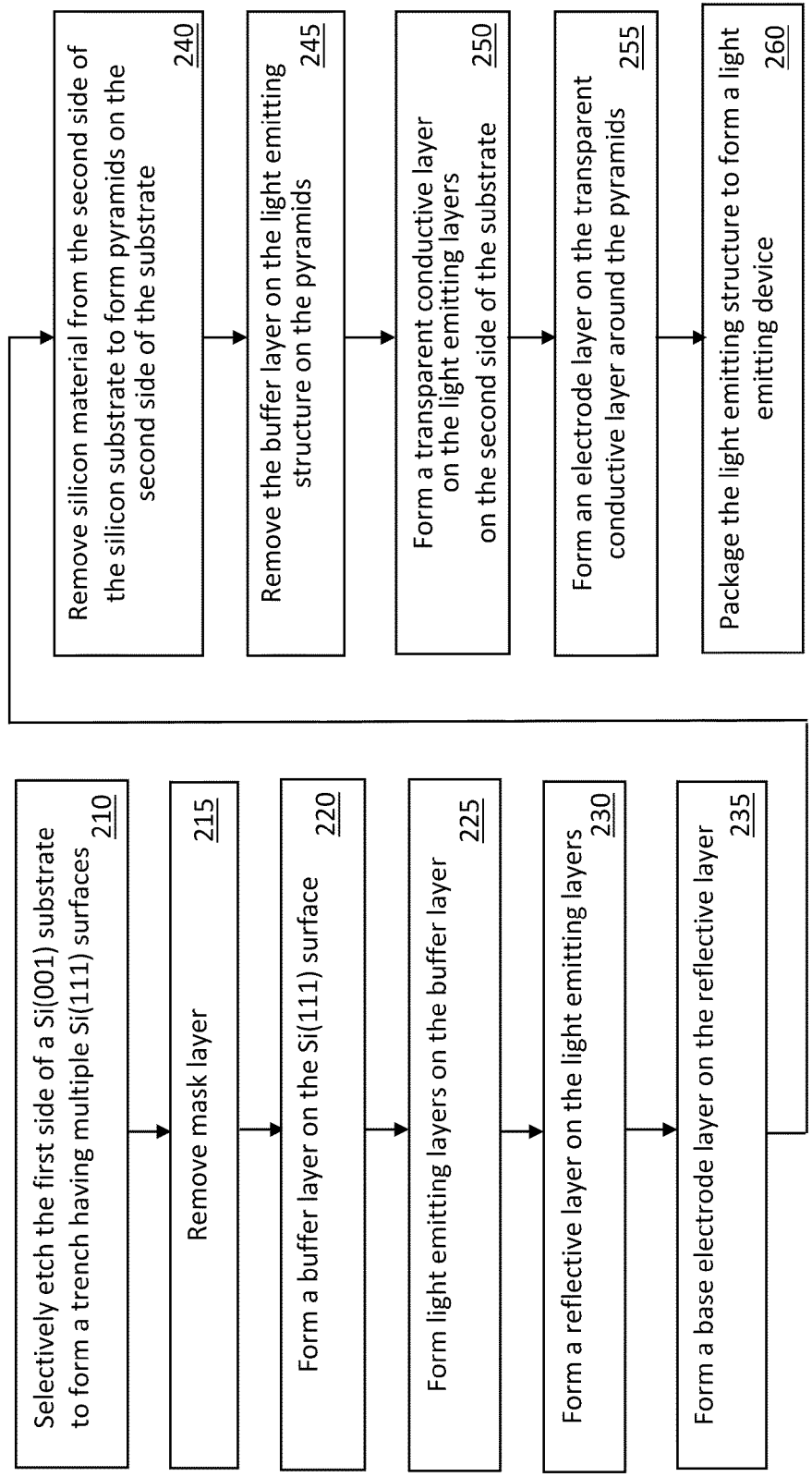
FIG. 2 is a flowchart for fabricating the light emission devices in accordance with the present invention.
Figure 3A:
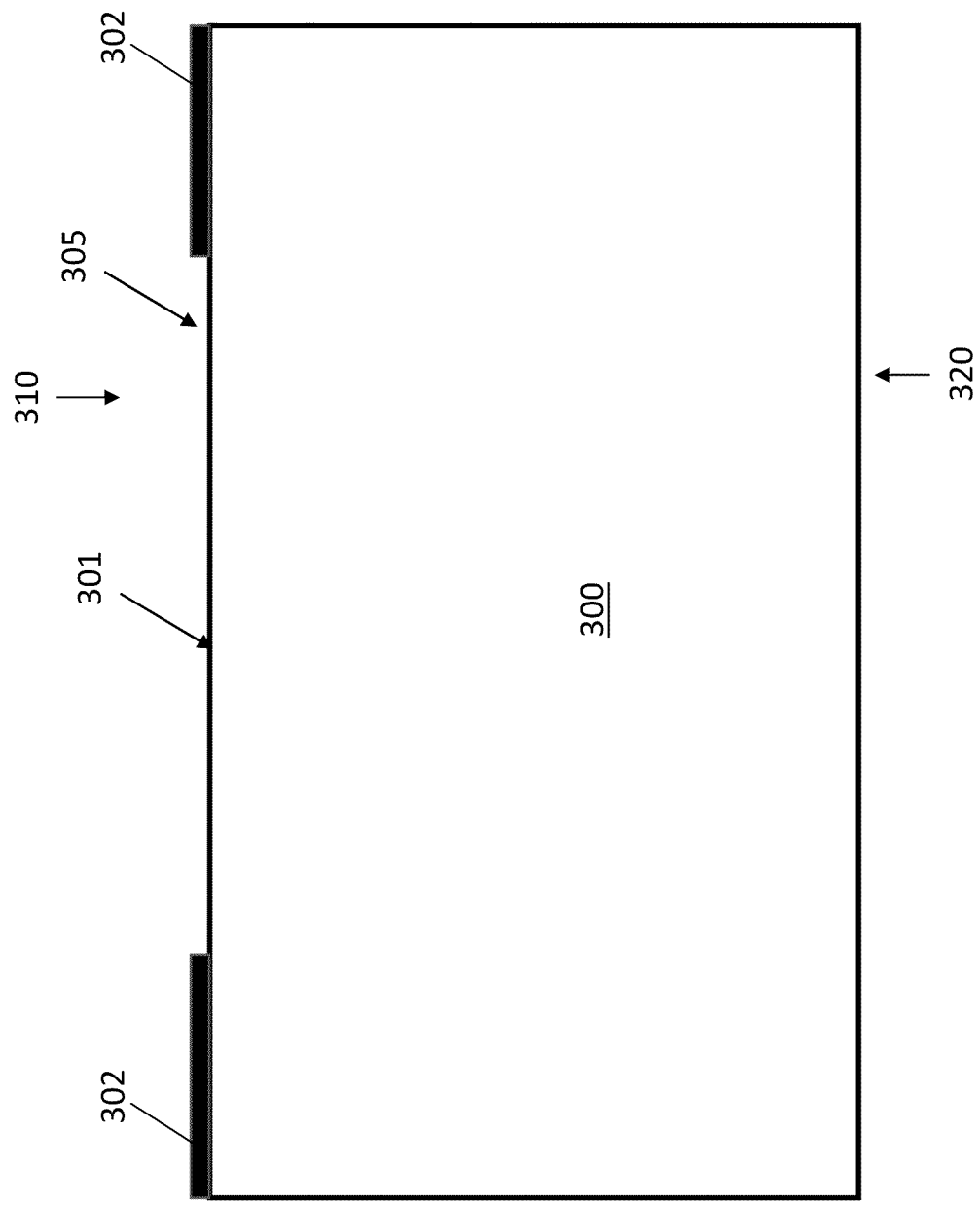
FIGS. 3A-3S are cross-sectional and perspective views illustrating the light emitting structures at different steps in the flowchart in FIG. 2 for fabricating the light emission device.
Figure 3B:
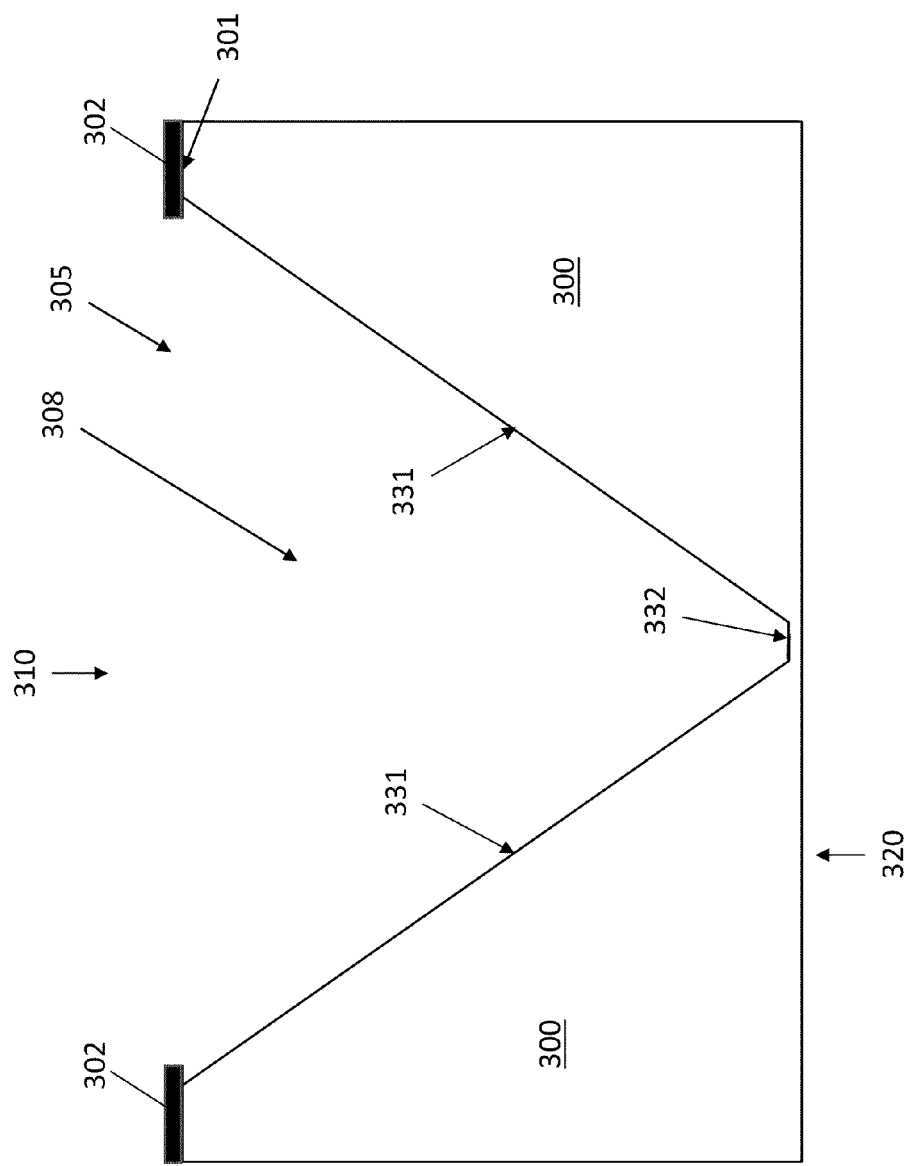
Figure 3C:
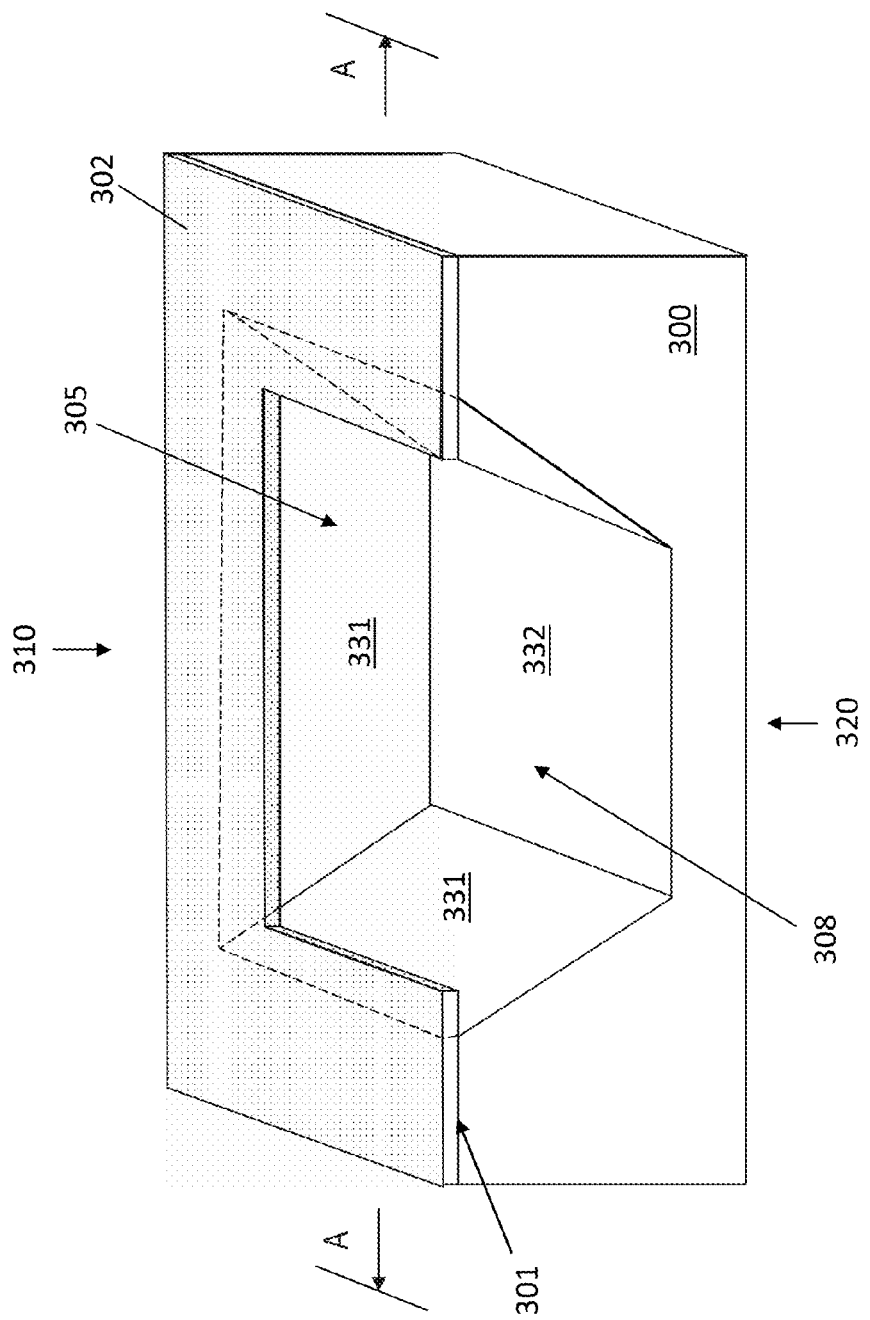
Figure 3D:
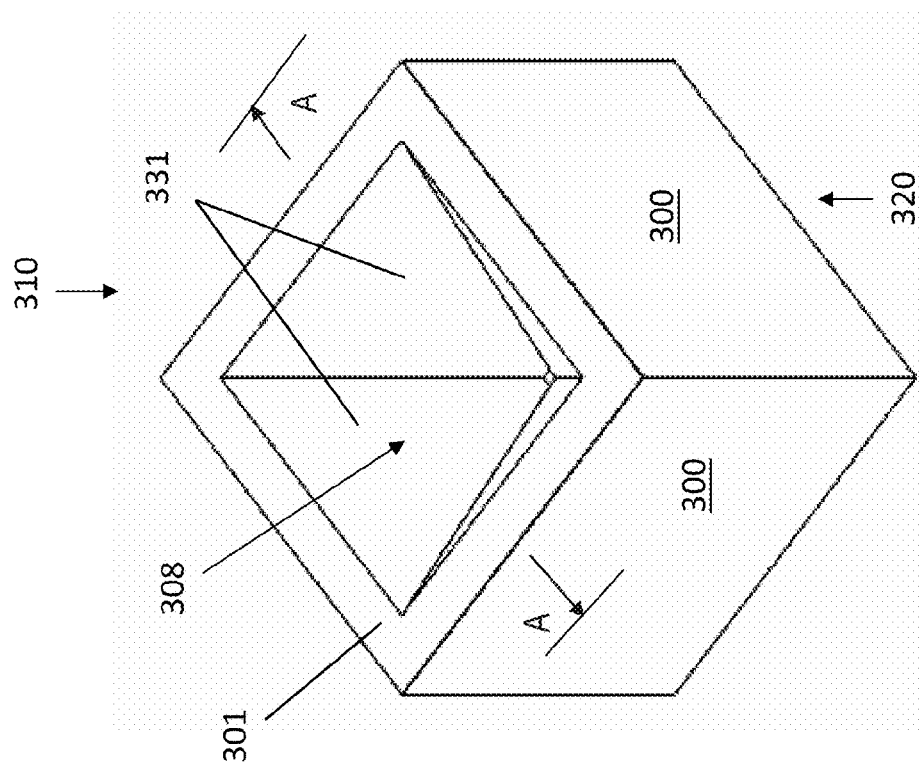

Referring to FIGS. 2 and 3A-3D (FIGS. 3A and 3B are cross-sectional views along the A-A direction in FIG. 3C), a silicon substrate 300 has a first side 310 and a second side 320 opposing to the first side 310. The silicon substrate 300 can for example be about 750 μm in thickness. The silicon substrate 300 includes a surface 301 on the first side 310. The substrate 300 can be a (100) silicon wafer, that is the surface 301 is along a (100) crystalline plane. A mask layer 302 is formed and patterned on the surface 301. The mask layer 302 can be formed by a silicon nitride layer. The mask layer 302 has an opening 305 that exposes the silicon substrate 300 on the first side 310. The silicon substrate 300 is then etched through the opening 305 to form a trench 308 (step 210). The trench 308 has a plurality of substantially flat surfaces 331 that are not parallel or be sloped relative to the surface 301. The surfaces 331 can form a reverse pyramid, or a truncated pyramid having a surface 332 that is substantially parallel to the surface 301. If the substrate 300 is a (100) silicon wafer, the surfaces 331 are (111) silicon surfaces and the surface 332 is a (100) silicon surface. The surfaces 331 are at a 54.7° angle relative to the surface 301 and the surface 332. The mask layer 302 is then removed, leaving a trench having sloped surfaces 331 in the substrate 300 on the first side 310 of the substrate 300 (step 215, FIG. 3D).

Figure 3E:
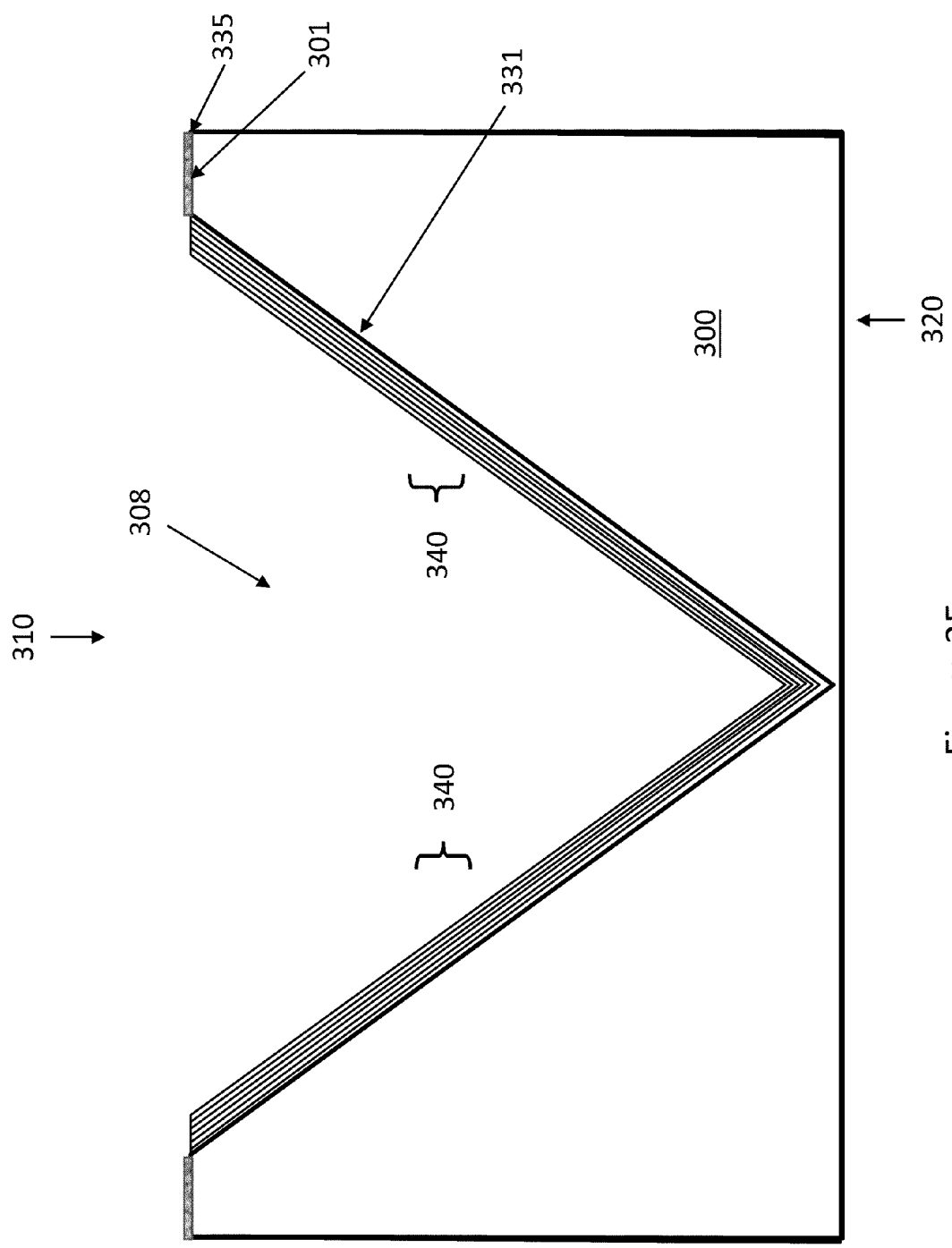
Figure 3F:
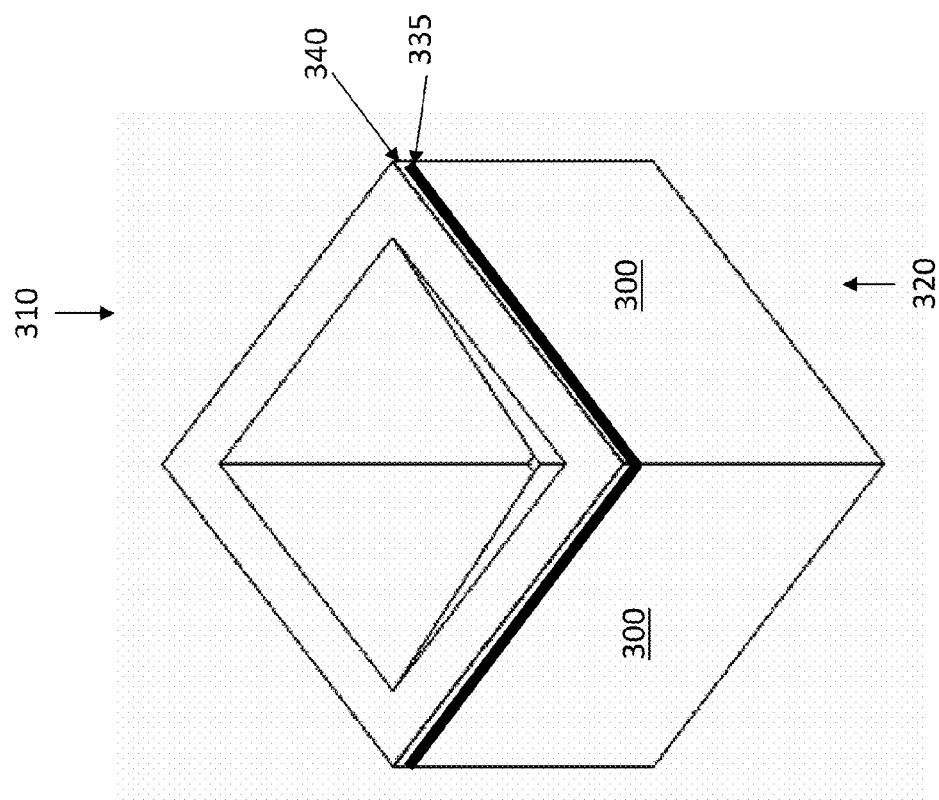

Referring to FIGS. 2, 3E and 3F, one or more buffer layers 335 are next formed on the surface 301 and surfaces 331 (step 220). The buffer layer(s) 335 can for example comprise AlN in a thickness range between about 1 nm and about 1000 nm, such as 10 to 100 Angstroms. The buffer layer(s) can include a thinner AlN layer (e.g. about 30 nm) formed on the substrate 300 at a lower substrate temperature (e.g. 700° C.) followed by a deposition of a thicker AlN layer (e.g. about 70 nm) formed on the first thinner AlN layer at a higher substrate temperature (e.g. 1,200° C.). The buffer layer(s) 335 can also be formed of GaN, ZnO, HfN, AlAs, TaN, or SiC.

A plurality of light emitting layers 340 are next formed on the buffer layer 335 (step 225). The light emitting layers 340 include semiconductor quantum well layers that can produce and confine electrons and holes under an electric field. The recombination of the electrons and the holes can produce light emission. The emission wavelengths are determined mostly by the bandgap of the material in the quantum-well layers. Exemplified light emitting layers 340 can include, from the buffer layer 335 and up, an AlGaN layer (about 4,000 Å in thickness), a GaN:Si layer (about 1.5 μm in thickness), an InGaN layer (about 50 Å in thickness), a GaN:Si layer (about 100 Å in thickness), an AlGaN:Mg layer (about 100 Å in thickness), and GaN: Mg (about 3,000 Å in thickness). The GaN:Si layer (about 1.5 μm in thickness) and the InGaN layer can be repeated several times (e.g. 3 to 7 times) on top of each other to form a periodic quantum well structure.

The buffer layer 335 and the light emitting layers 340 can be formed using atomic layer deposition (ALD), Metal Organic Chemical Vapor Deposition (MOCVD), Plasma Enhanced Chemical Vapor Deposition (PECVD), Chemical Vapor Deposition (CVD), or Physical vapor deposition (PVD). The formation of the buffer layer(s) 335 between the substrate 300 and the light emitting layers 340 can reduce mechanical strain between the (111) silicon surfaces of the substrate 300 and the light emitting layers 340, and prevent cracking and delamination in the light emitting layers 340. As a result, the quantum-well layers can have monolithic crystal structures with matched crystal lattices. Light emitting efficiency of the LED device can be improved. Details of forming trenches, the buffer layer, and the light emitting layers are disclosed in patent application Ser. No. 12/177,114, titled "Light Emitting Device" filed on Jul. 21, 2008 and patent application Ser. No. 11/761,446, titled "Silicon Based Solid State Lighting" filed on Jun. 12, 2007 both by the present inventor, the disclosures of which are incorporated herein by reference.

Figure 3G:
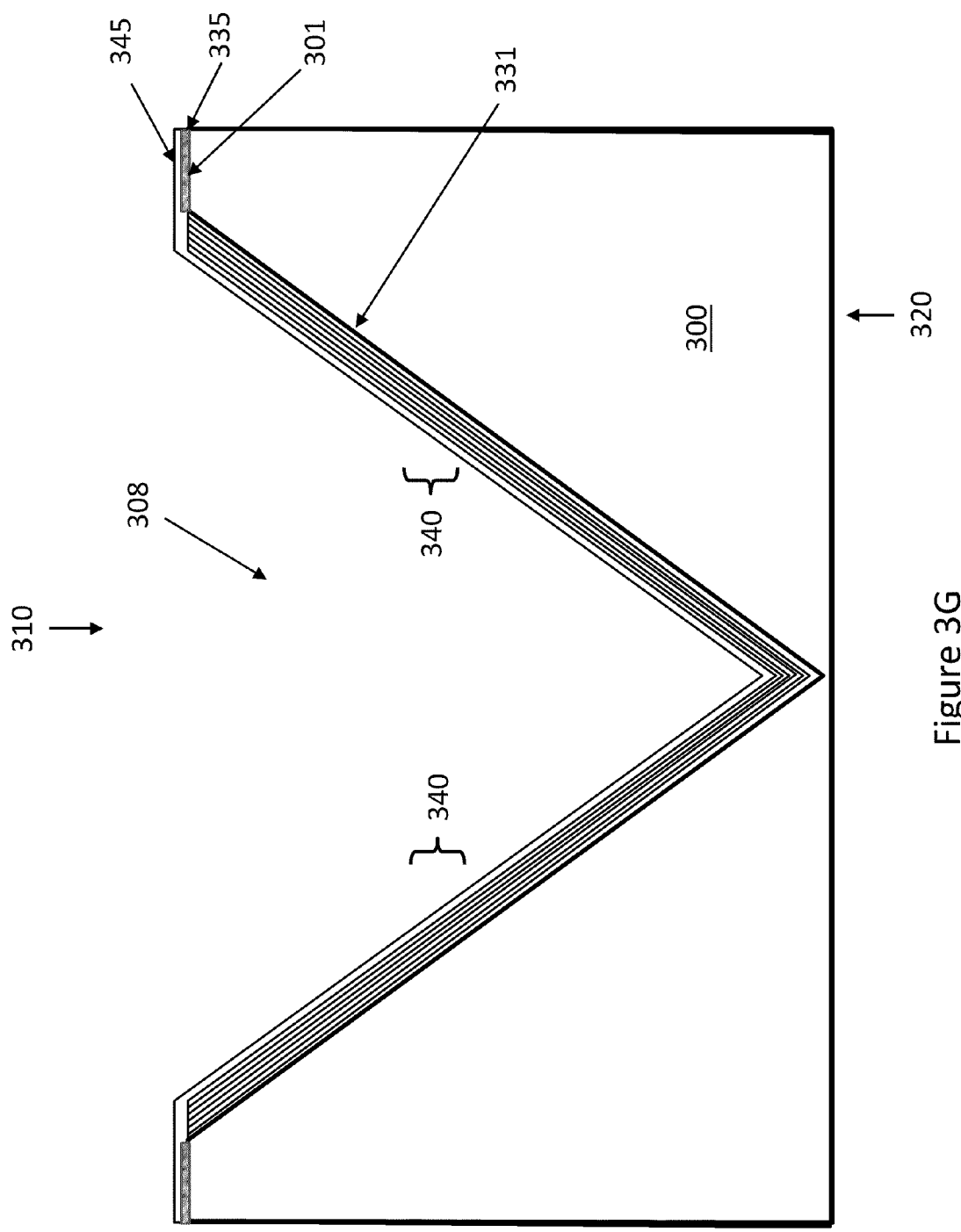

A reflective layer 345 is next, referring to FIGS. 2 and 3G, formed on the light emitting layers 340 (step 230). The reflective layer 345 can be formed by a layer of Aluminum approximately 500 nm in thickness.

Figure 3H:
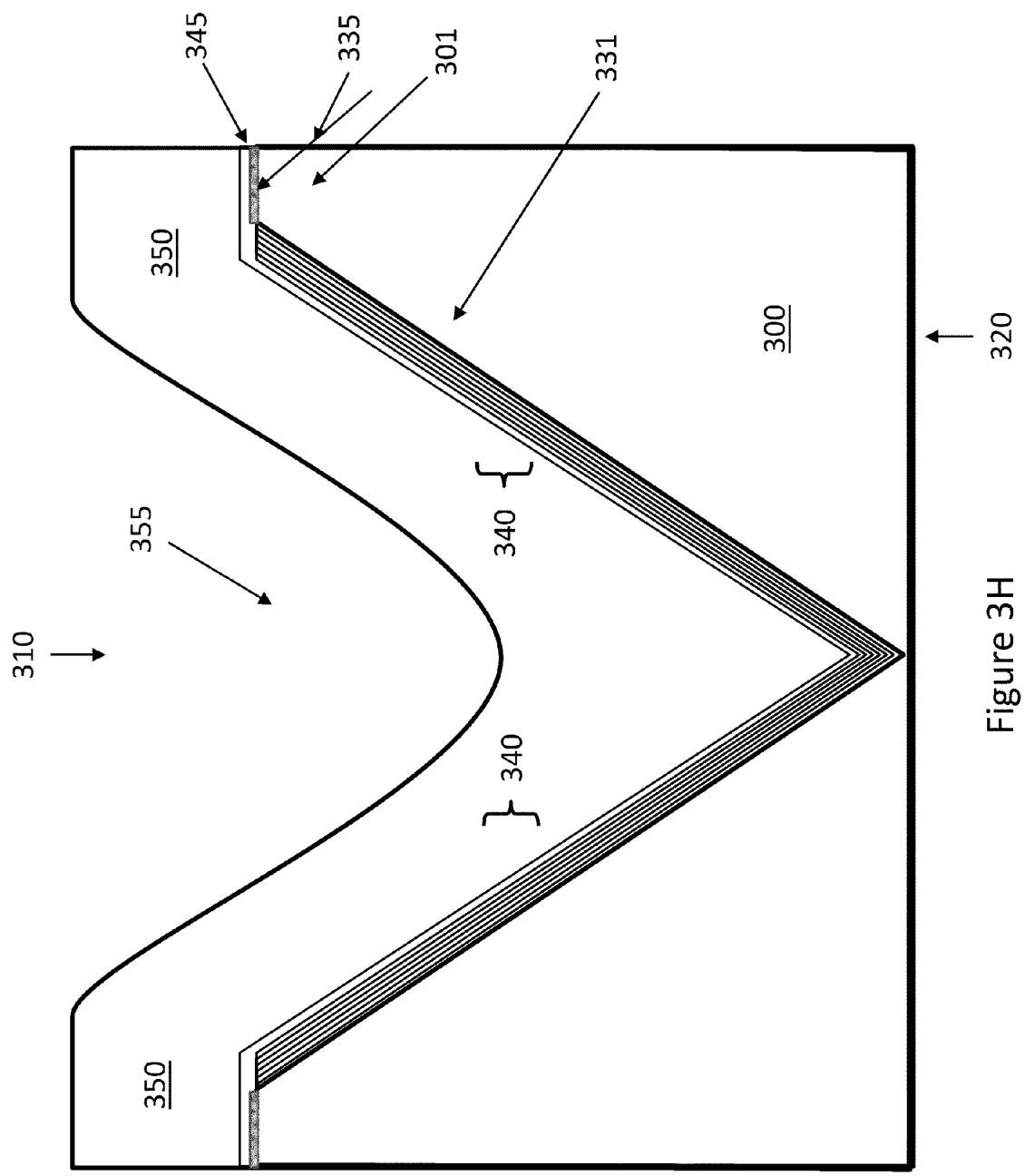
Figure 3I:
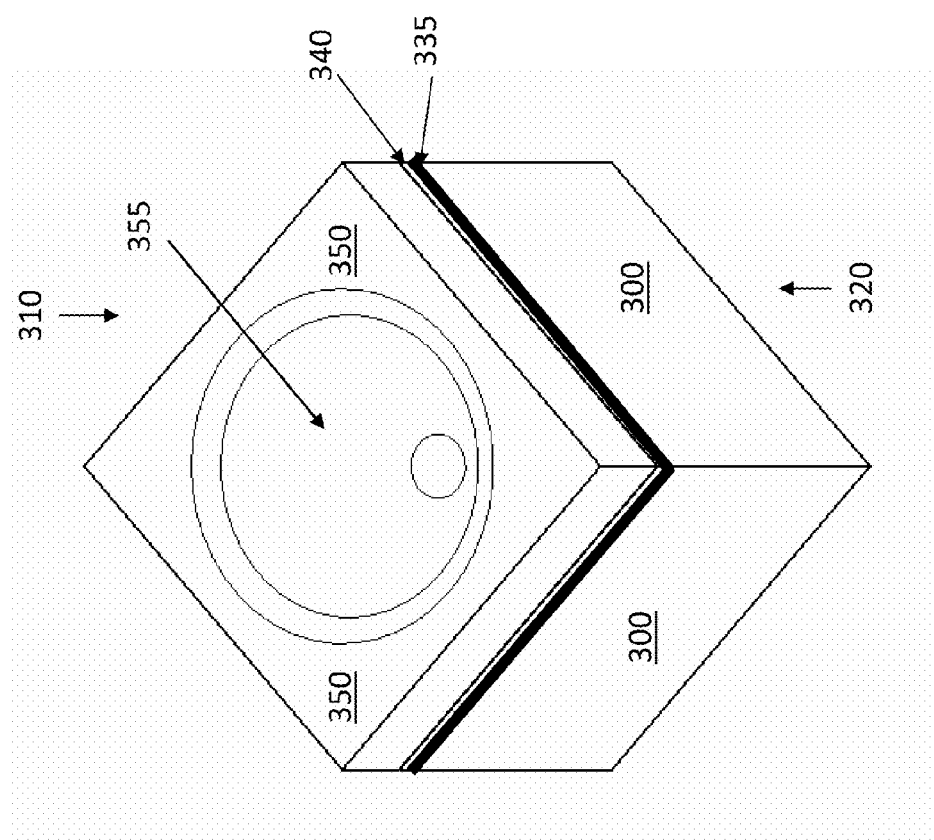

A base electrode layer 350 is next formed on the reflective layer (FIG. 3H, step 235). The base electrode layer 350 can include a metallic material such as copper, aluminum, and steel, and can be formed by electroplating. The base electrode layer 350 can also include a conductive polymer material, which can be formed by coating. The base electrode layer 350 can have a layer thickness about 200 μm. As described below, the base electrode layer 350 can be used as one of the electrodes for applying electric field across the light emitting layers 340 and for cooling the light emitting device during operation. The base electrode layer 350 can fill at least a portion of the trench 308, which can leave a dimple 355, as shown in FIGS. 3H-3J. A plurality of trenches 308 and related light emission layers 340 can be simultaneously formed on a single substrate (300) such as a silicon wafer, as shown in FIG. 3J.

Figure 3K:
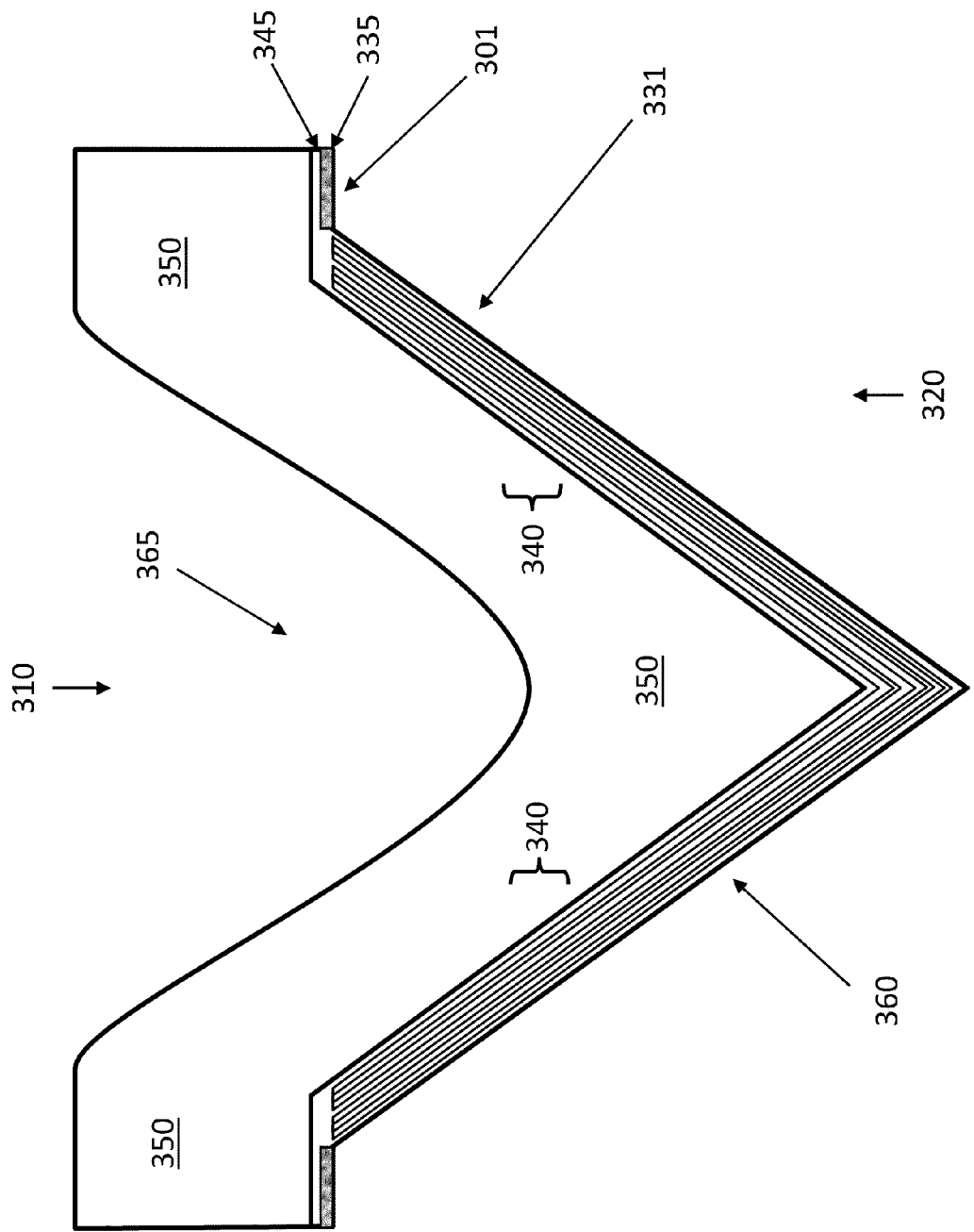
Figure 3L:
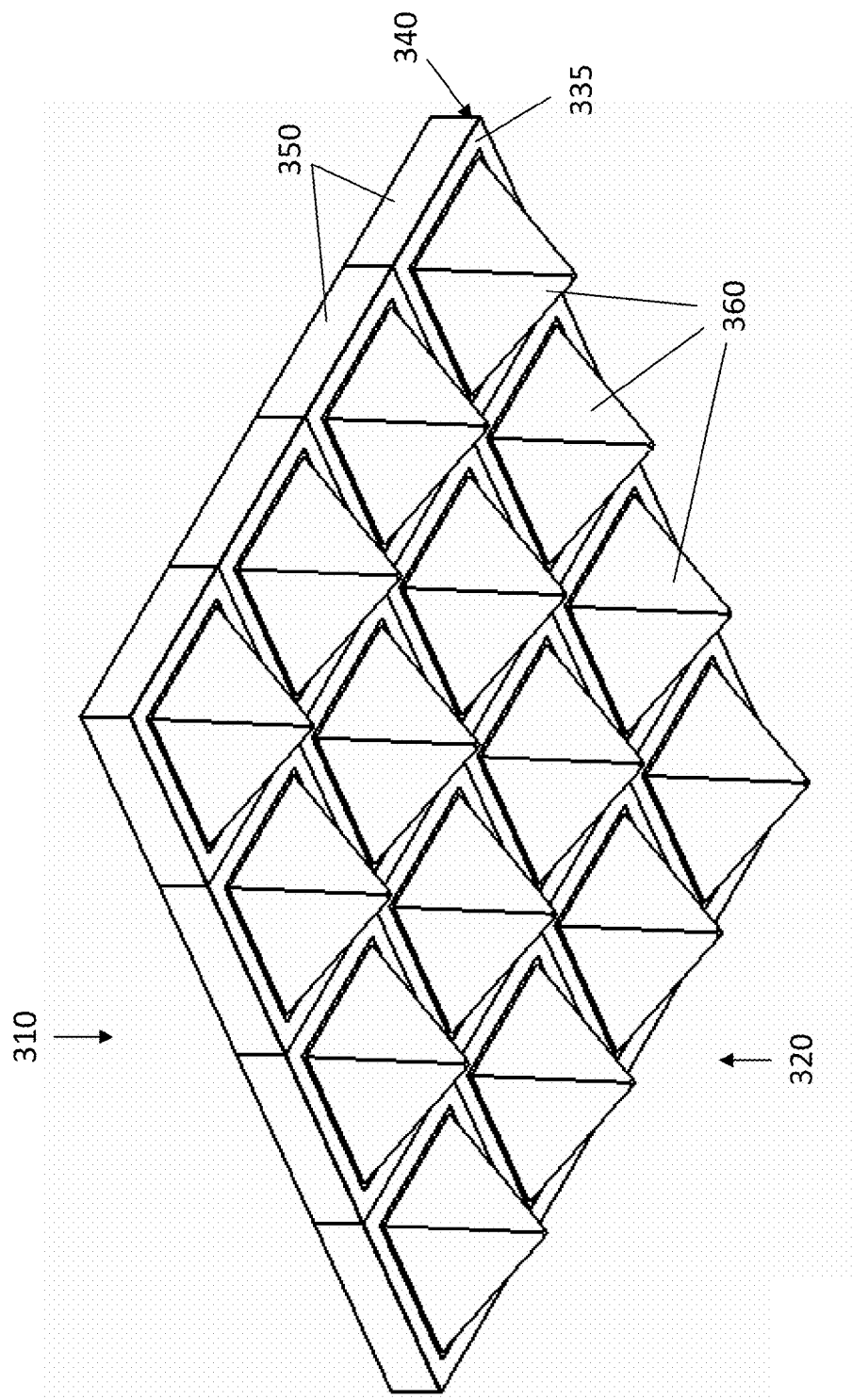
Figure 3M:
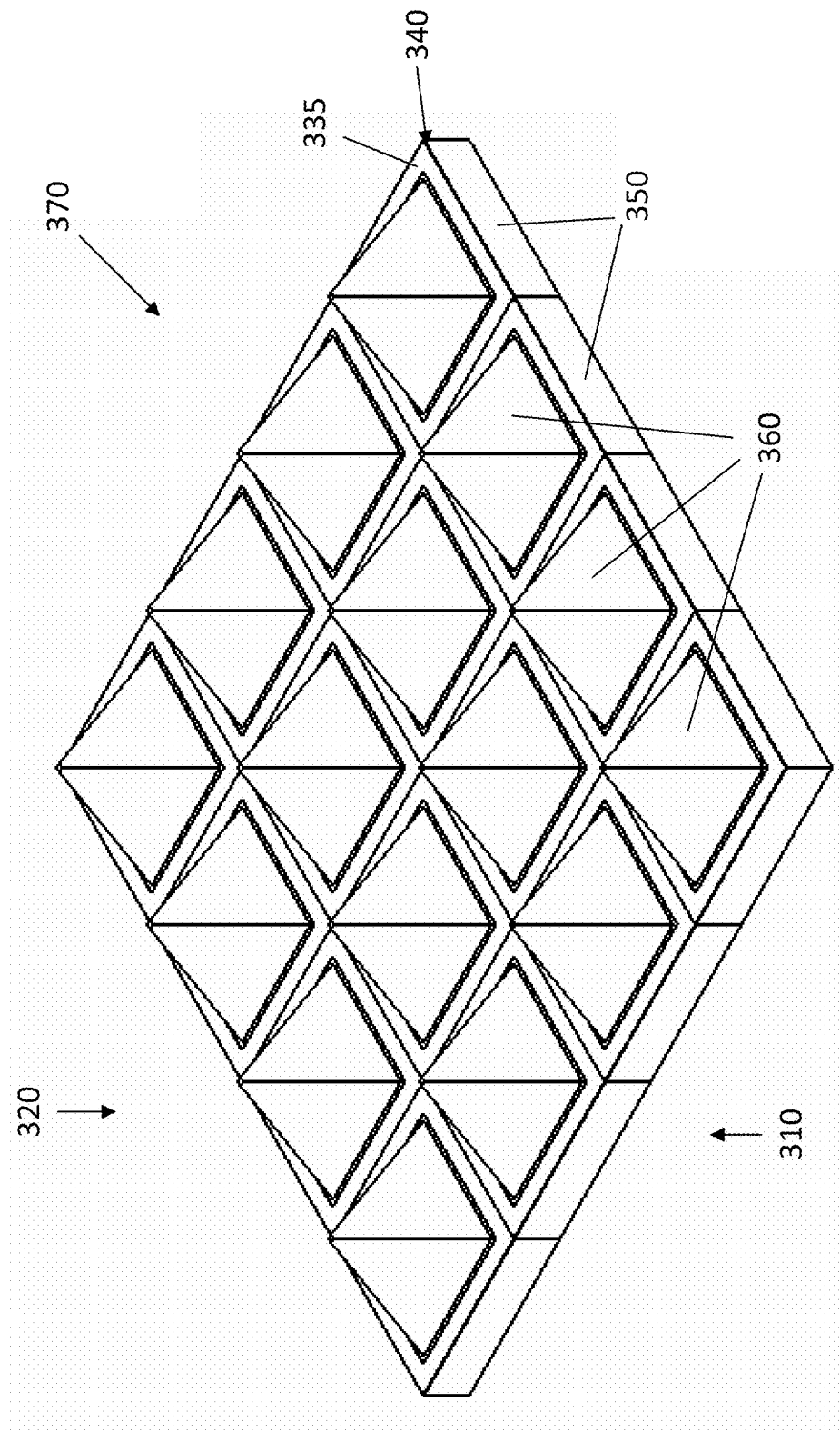
Figure 3N:
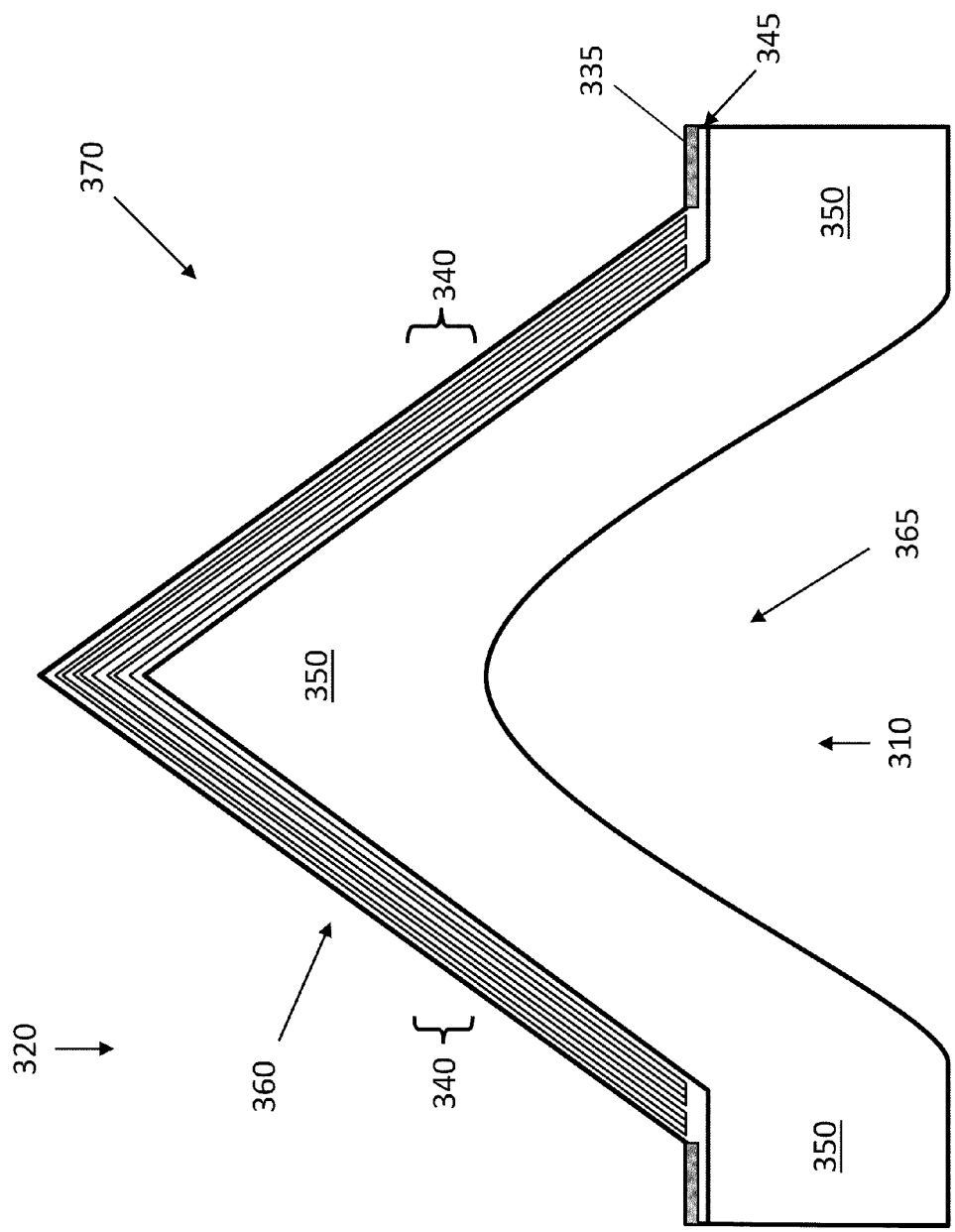
Figure 30:
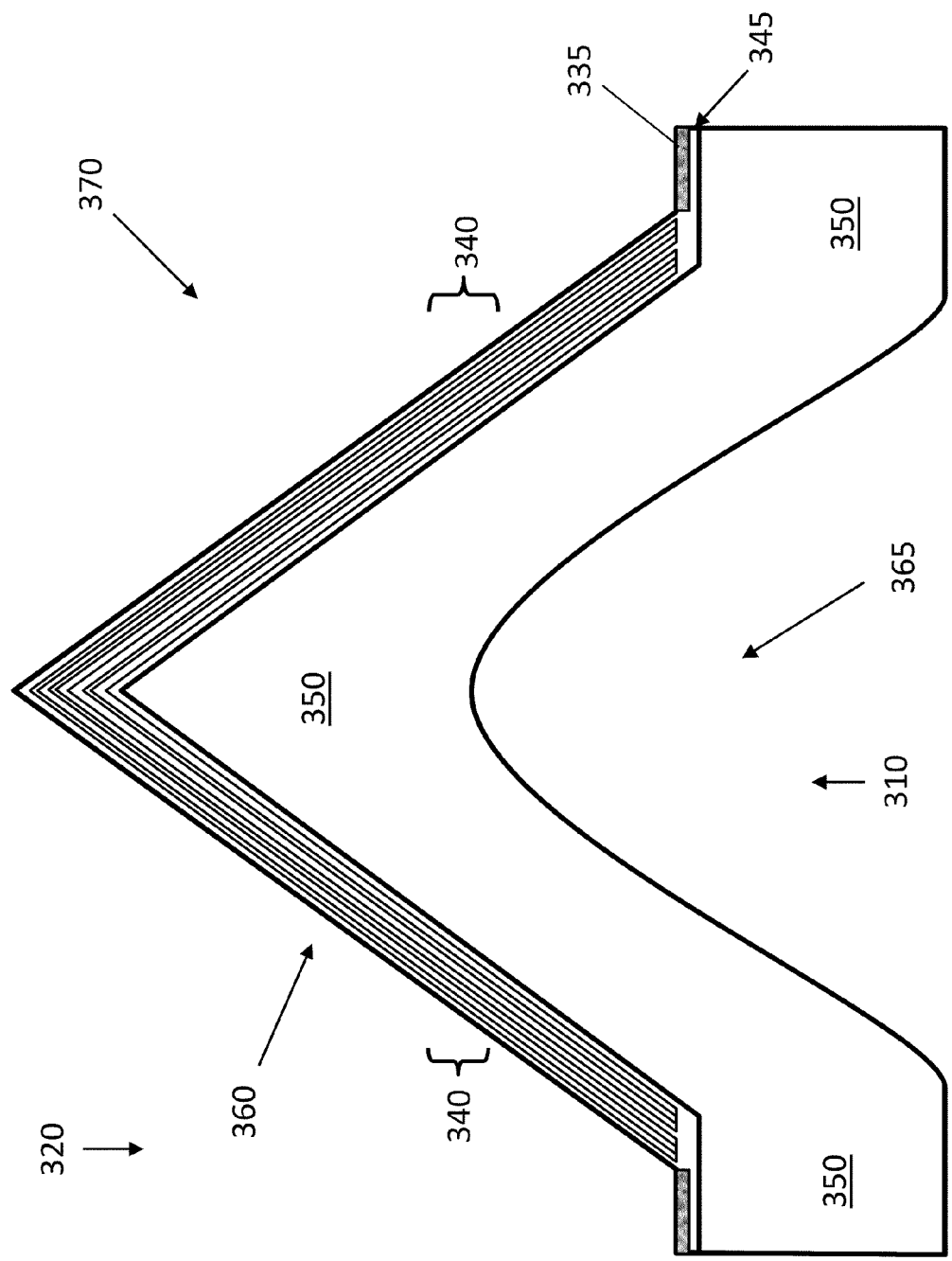

Next, the silicon material in the substrate 300 is removed from the second side 320 below the buffer layer 335 and the light emitting layers 340 to expose the buffer layer 335 (FIG. 3K, step 240). As shown in a bottom perspective view of FIG. 3L, the buffer layer 335 and the light emitting layers 340 are thus disposed on the pyramids 360 on the second side 320 of the substrate 300 (not shown in FIG. 3L because the silicon material in the substrate 300 has been removed). As a result, a light emitting structure 370 is partially formed. The light emitting structure 370 is also shown in a top perspective view in FIG. 3M and in a cross-sectional view in FIG. 3N with the first side 310 and the second side 320 are reversed in position (the reflective layer 345 is not shown in FIGS. 3L and 3M due to drawing scale).

Figure 3P:
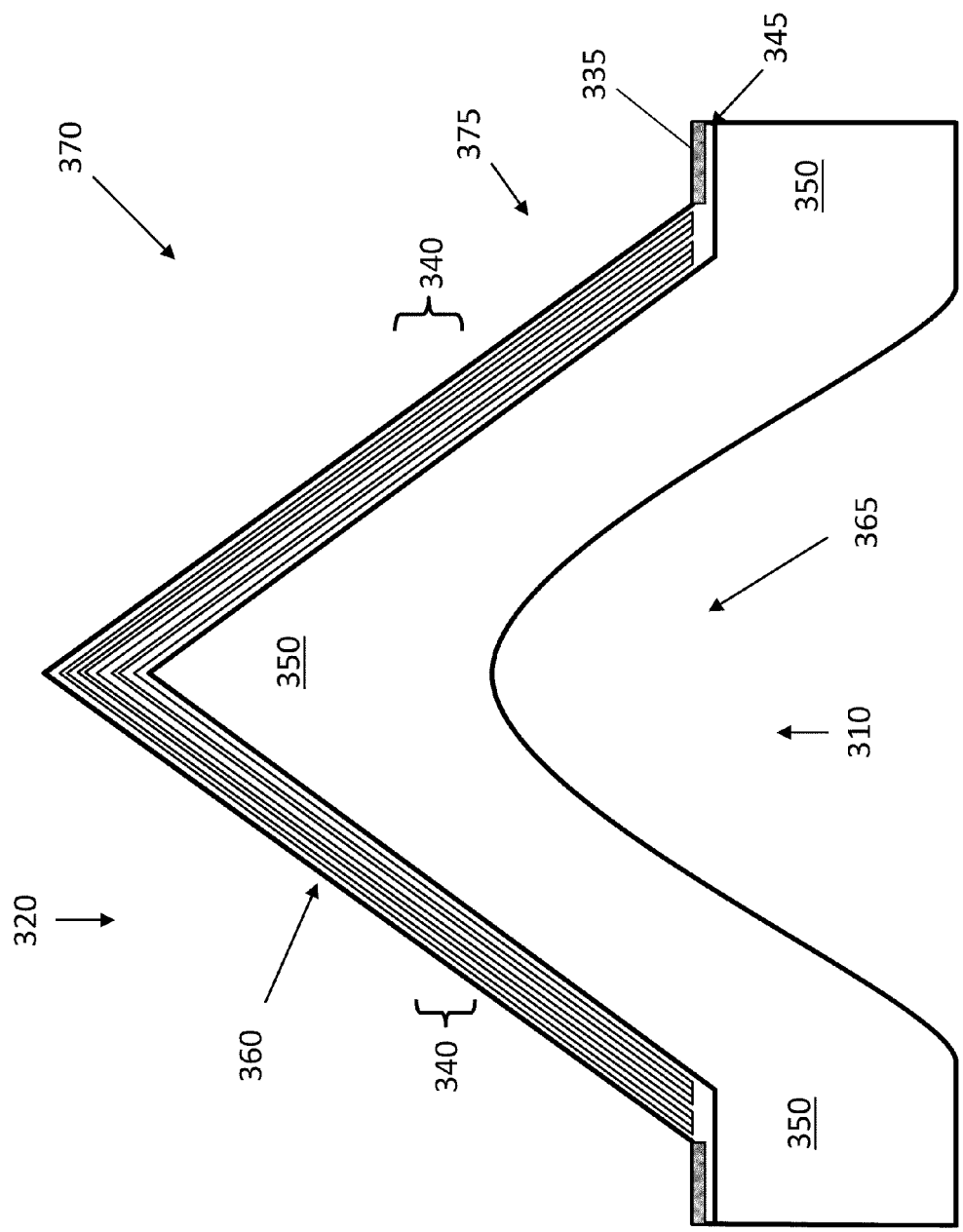

Next, the buffer layer(s) 335 are removed from the second side 320 of the light emitting structure 370 (FIG. 3O, step 245). The light emitting layers 340 are exposed to the second side 320. A transparent conductive layer 375 comprising for example indium titanium oxide (ITO) is next formed on the light emitting layers on the second side of the substrate (FIG. 3P, step 250). The removal of the buffer layer(s) 335 allows the transparent conductive layer 375 to be in contact with the light emitting layers 340 to allow a voltage to be applied across the light emitting layers 340.

Figure 3Q:
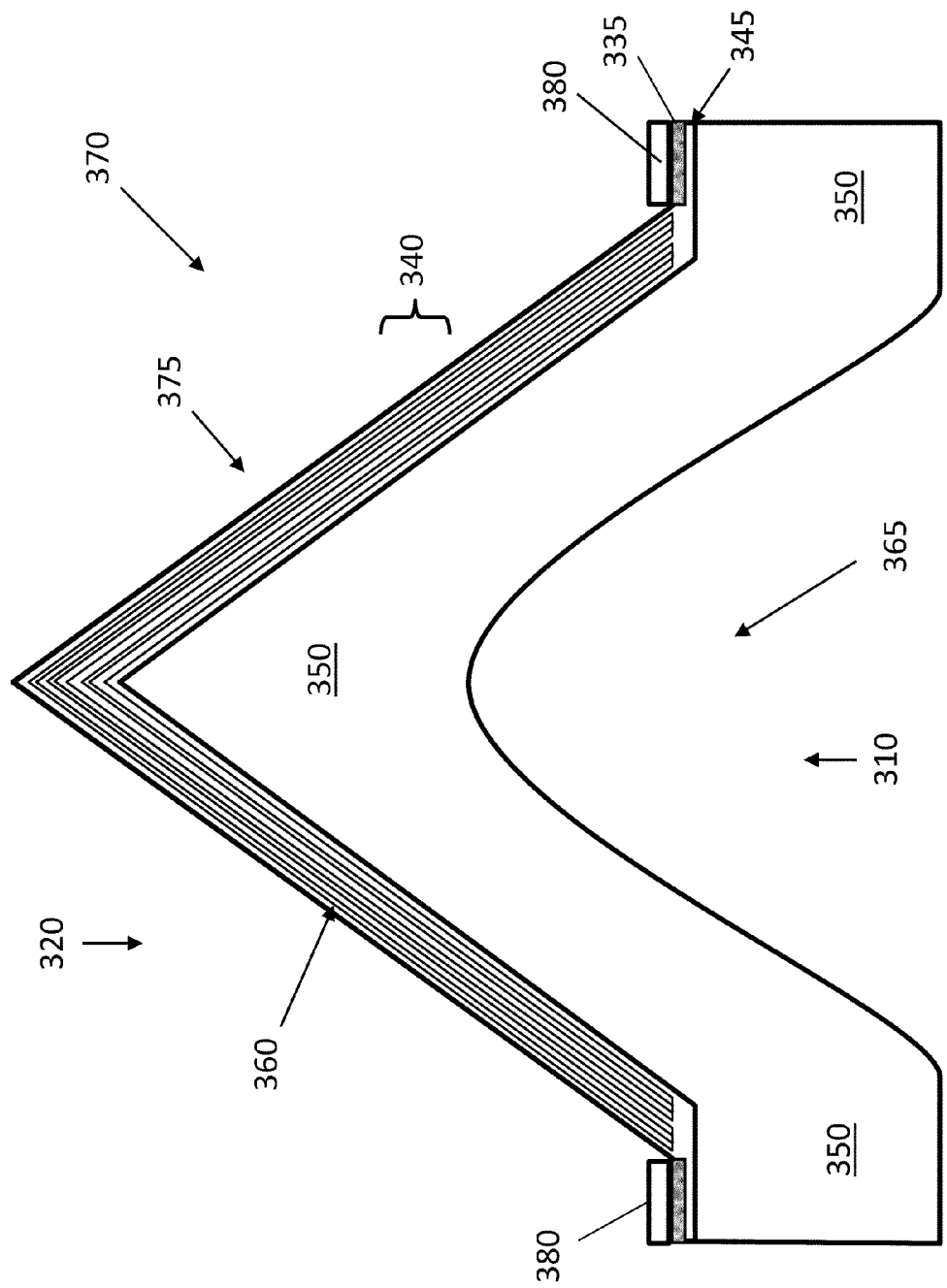
Figure 3R:
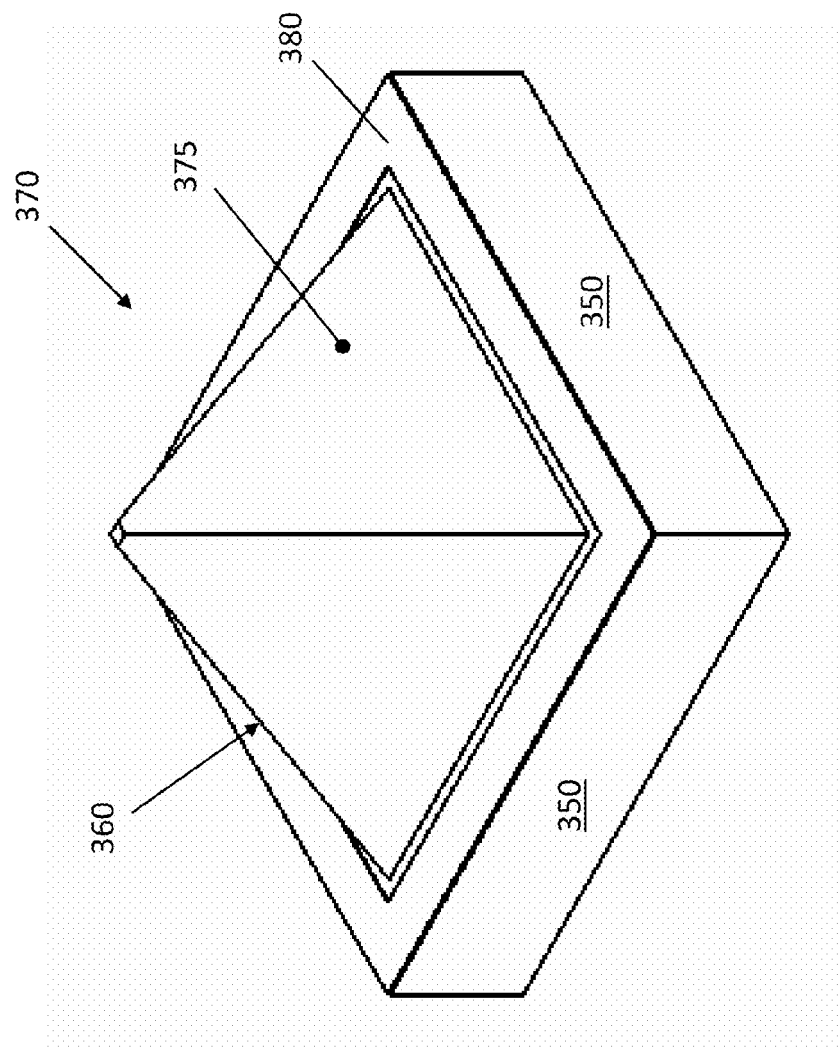
Figure 3S:
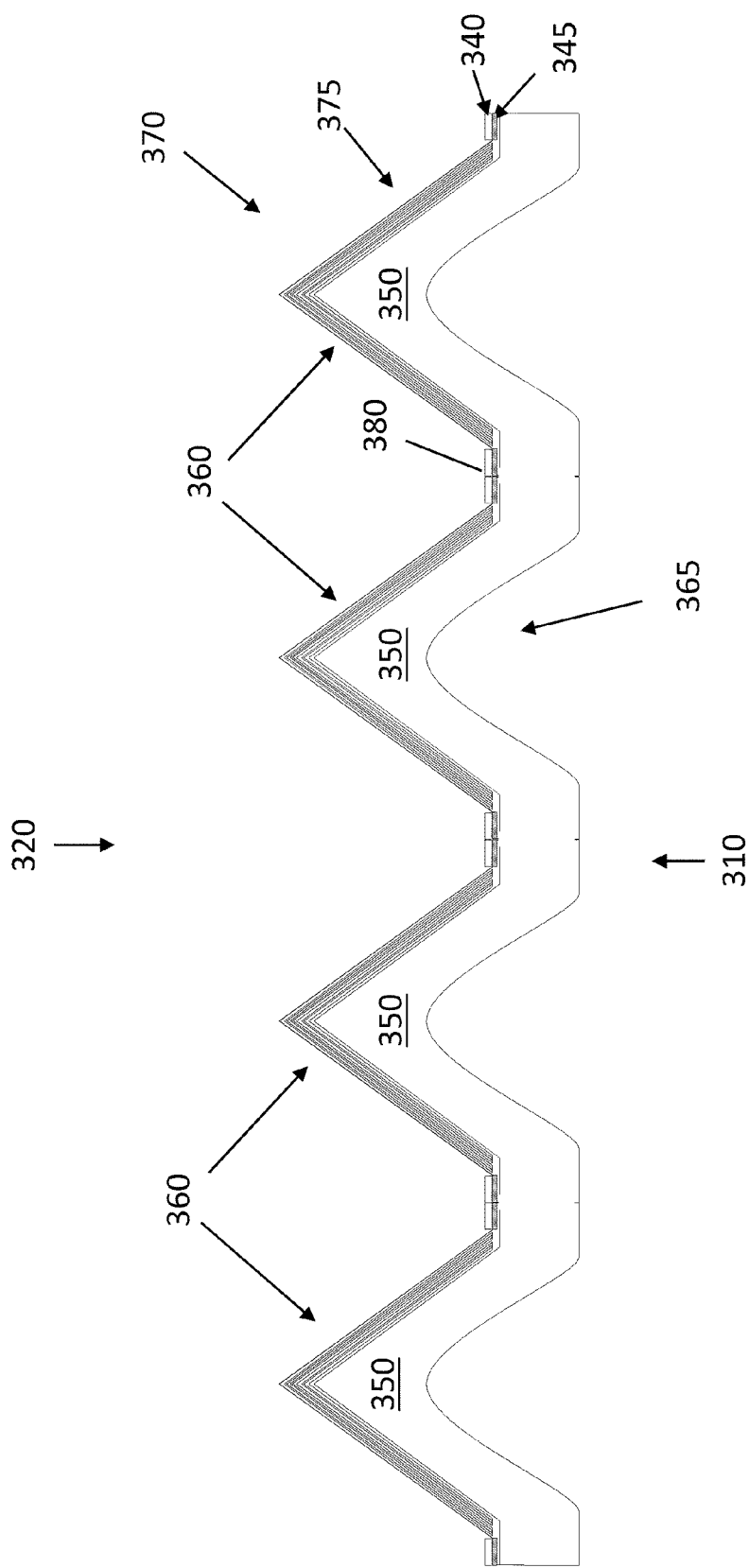

An electrode ring layer 380 is next formed on the transparent conductive layer 375 around the pyramids as shown in FIGS. 3Q-3S (step 255). (The light emitting layer 340 and the reflective layer 345 in FIG. 3R are not shown due to drawing scale). The electrode ring layer 380 can be formed by the same material (e.g. copper) as the base electrode layer 350. A notable feature of the light emitting structure 370 is that the quantum-well layers having monolithic crystal structures are formed over a non-crystalline conductive substrate that are made of metals or conductive polymers. The monolithic crystal structures of the quantum well layers allows the light emission layers 340 that comprise the monolithic quantum layers to have high light emission efficiency. The non-crystalline conductive substrate functions as one of the two electrodes for applying the electric field, and can provide cooling to the light emission device during operation.

Figure 4B:
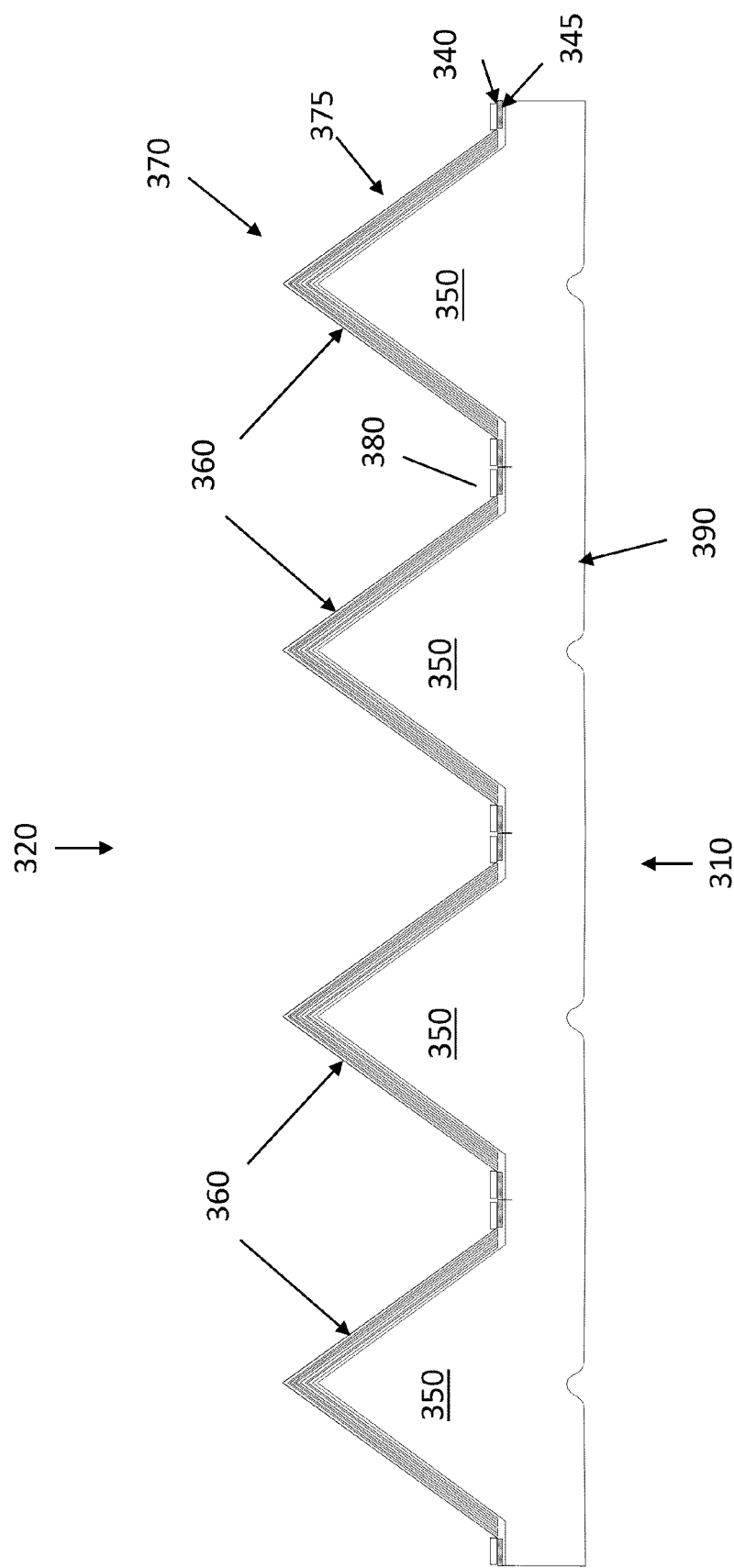
FIG. 4B is a detailed cross-sectional view illustrating a light emission structure with a flat conductive surface.

It should be understood that the shape and the size the dimple 355 may vary with the dimension of the light emission structure 370. A light emission structure having a lateral dimension of 5 mm or larger may have a large and deep dimple 355 in the base electrode layer 350 as shown in FIG. 3H. A light emission structure 370 having a lateral dimension smaller than 5 mm may have a large and deep dimple 355 in the base electrode layer 350 as shown in FIG. 4A. Furthermore, as shown in FIG. 4B, the base electrode layer 350 can be flattened on the first side 310 by for example chemical mechanical polishing a flat conductive surface. The base electrode layer 350 can thus have a substantially flat surface 390 on the first side 310 opposing to the light emission side (the second side 320) of the base electrode layer 350.

Figure 5A:
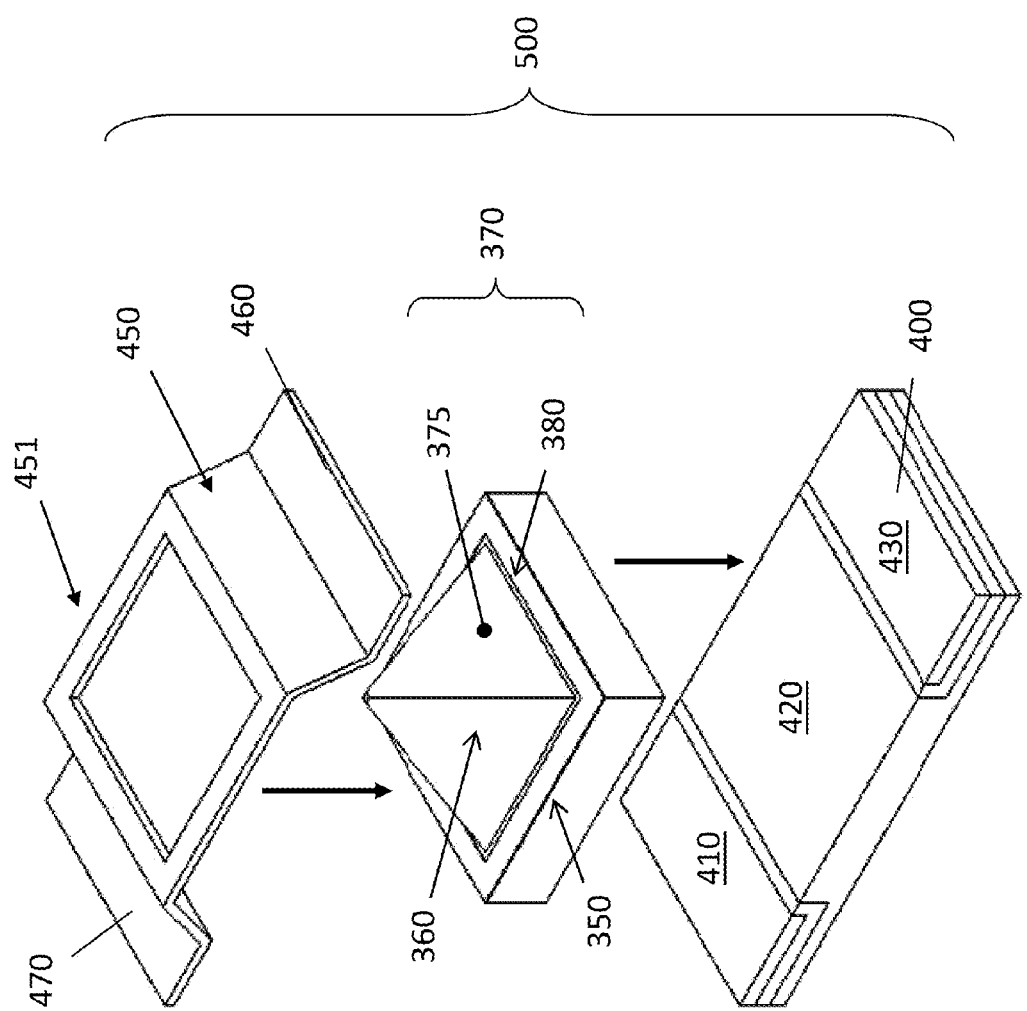
FIGS. 5A and 5B show the packaging of the light emission devices into light emitting modules.
Figure 5B:
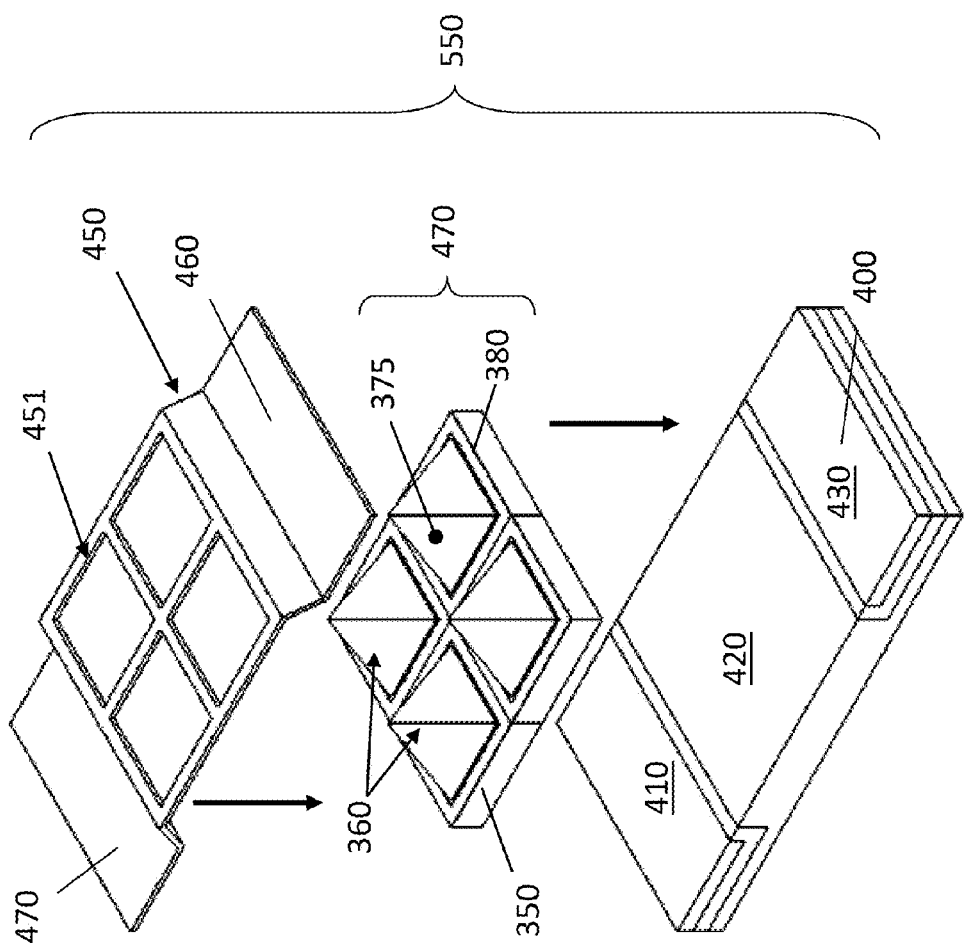

FIGS. 5A and 5B respectively show exploded views light emission modules 500 and 550, and the packaging of light emission structures 370 into light emitting modules 500 and 550 (step 260 in FIG. 2). An insulating substrate 400 includes on its upper surface electrode layers 410, 420, 430. The insulating substrate 400 can be made of an insulating ceramic material, which can act as a heat sink. The light emission structure 370 includes a pyramid 360 on the base electrode layer 350. A plurality of light emission layers (not shown) are formed on the pyramid 360. The transparent conductive layer 375 is formed on the light emission layers. The electrode ring layer 380 is formed around the pyramid 360 and in contact with the transparent conductive layer 375. The light emission structure 370 can be mounted directly on the electrode layer 420 on the insulating substrate 400 such that the electrode layer 420 is in electric contact with the base electrode layer 350. An electric interconnect 450 includes a window frame 451 having an opening therein and connected with two arms 460 and 470. The electric interconnect 450 is made of an electrically conductive material such as copper. The electric interconnect 450 can be clamped down such that the window frame 451 is in electric contact with the electrode ring layer 380. The two arms 460 and 470 become respectively in contact with the electrode layers 410 and 430.

When the electric interconnect 450 and the light emission structure 370 are tightly clamped to the substrate 400, the electrode layers 410 and 430 are connected with the transparent conductive layer 375. The electrode layer 420 is connected with the base electrode layer 350. An electric voltage applied across the electrode layer 420 and the electrode layers 410 and 430 can thus produce an electric field across the light emission layers 340 (in FIGS. 3Q and 4, not shown in FIG. 5A), which can cause light emission in the light emission module 500.

Referring to FIG. 5B, a light emission structure 470 can have a plurality of pyramids 360 formed on a common base electrode layer 350. A plurality of light emission layers (not shown due to drawing scale) are formed on the pyramids 360. The transparent conductive layer 375 is formed on the light emission layers. A common electrode ring layer 380 is formed around the pyramids 360 and in contact with the transparent conductive layer 375.

When the electric interconnect 450 and the light emission structure 470 are tightly clamped to the substrate 400, the electrode layers 410 and 430 are connected with the transparent conductive layer 375. The electrode layer 420 is connected with the base electrode layer 350. An electric voltage applied across the electrode layer 420 and the electrode layers 410 and 430 can thus produce an electric field across the light emission layers 340 (in FIGS. 3Q and 4, not shown in FIG. 5A), which can cause light emission in the light emission module 550.

An advantage of the light emission modules 500 and 550 is that there is no need for wire bonding to electrically connect the light emission structures 370 to external electrodes (410-430). As it is known that wire bonding is easily damaged in the handling, the disclosed light emission modules are thus more reliable than some conventional solid-state light emitting devices.

The packaging of light emitting modules (step 260 in FIG. 2) can also include dicing of light emitting structures on a substrate into dies each containing smaller number of light emitting structures. For example, the light emitting structures 370 on the conductive substrate 350 in FIG. 4B can be diced into dies each containing one or a few light emitting structures which can subsequently form a light emitting module as shown in FIGS. 5A and 5B.

Figure 6:
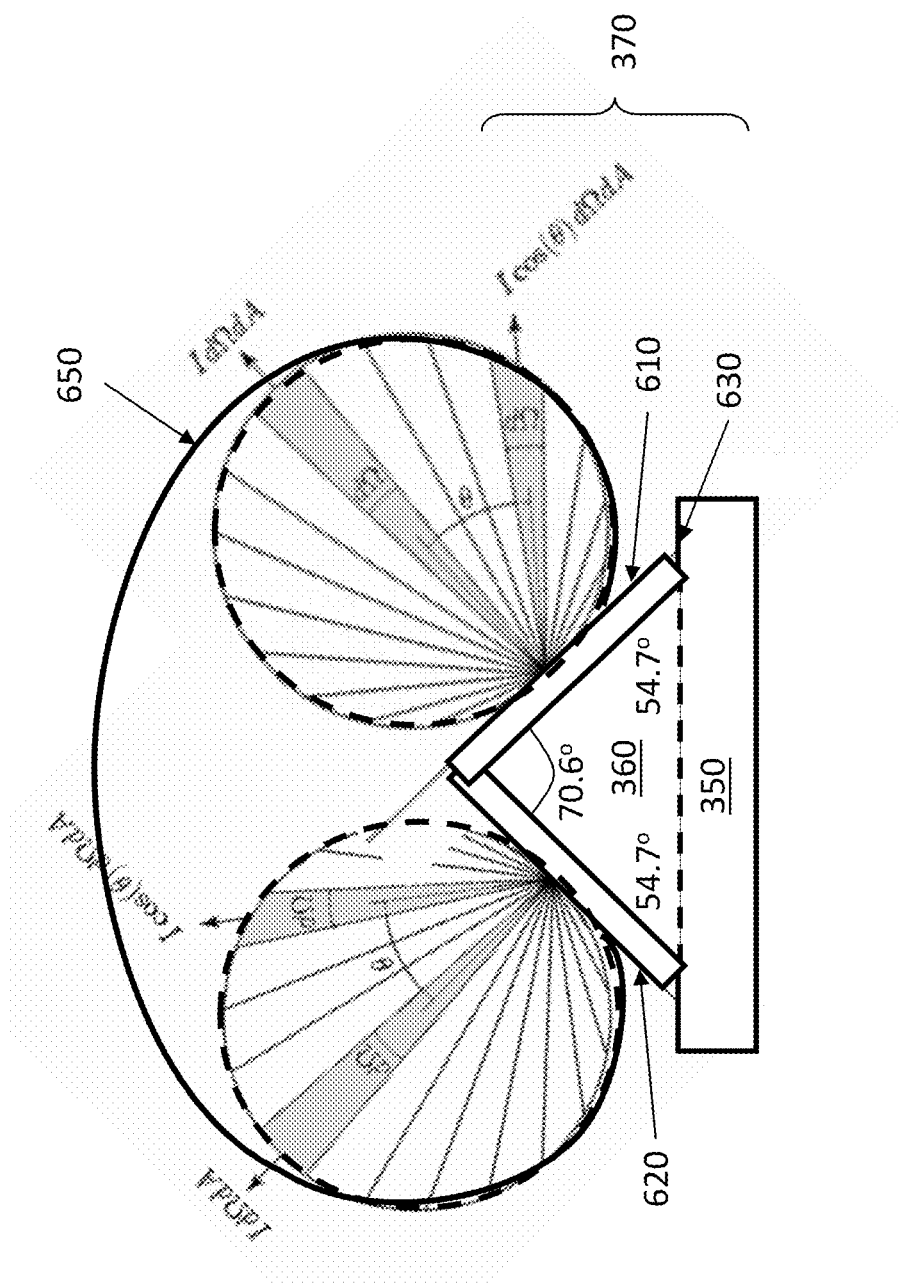
FIG. 6 is a schematic diagram illustrating angular distribution of light emission from the light emitting device in accordance with the present invention.

FIG. 6 is a schematic diagram illustrating angular distribution of light emission from the light emitting device in accordance with the present invention. A light emitting device 370 includes a pyramid 360 formed on a base electrode layer 350. Light emitting layers having light emission surfaces 610, 620 are formed on the sloped surfaces of the pyramid 360. If the light emission structure 370 is formed with a (100) silicon wafer, the upper surface 630 is along the (100) crystalline plane and the light emission surfaces 610, 620 parallel to the (111) crystalline planes. The light emission surfaces 610, 620 are at a 54.7° angle relative to the upper surface 630. For the same foot print on the upper surface, the sum of the areas of the emission surfaces on the light emission surfaces 610, 620 is approximately 1.73 times the area of the upper surface 630 under the pyramid 360. The light emission from the light emission surfaces 610, 620 can assume a broad distribution 1280 as shown in FIG. 6.

An advantage associated with the disclosed light emission device and fabrication processes is that light emitting layers are constructed on surfaces sloped relative to the substrate, which can significantly increase light emission areas and efficiency. Another advantage of the disclosed light emission device and fabrication processes is that silicon wafers can be used to produce solid state LEDs. Manufacturing throughput can be much improved since silicon wafer can be provided in much larger dimensions (e.g. 8 inch, 12 inch, or larger) compared to the substrates used in the conventional LED structures. Furthermore, the silicon-based substrate can also allow driving and control circuit to be fabricated in the substrate. The light emission device can thus be made more integrated and compact than conventional LED devices. Another advantage associated with the disclosed devices and fabrication processes is that the disclosed light emitting structures can be fabricated using existing commercial semiconductor processing equipment such as ALD and MOCVD systems. The disclosed fabrication processes can thus be more efficient in cost and time that some conventional LED structures that need customized fabrication equipments. The disclosed fabrication processes are also more suitable for high-volume semiconductor lighting device manufacture. Yet another advantage of the disclosed light emitting structures and fabrication processes is that multiple buffer layers can be formed to smoothly match the crystal lattices of the silicon substrate and the lower group III-V nitride layer. Yet another advantage of the disclosed LED structures and fabrication processes is that a transparent conductive layer formed on the light emitting layers and a reflective layer formed under the light emitting layers can maximize light emission intensity from the upper surfaces of the LED structures.

The foregoing descriptions and drawings should be considered as illustrative only of the principles of the invention. The invention may be configured in a variety of shapes and sizes and is not limited by the dimensions of the preferred embodiment. Numerous applications of the present invention will readily occur to those skilled in the art. Therefore, it is not desired to limit the invention to the specific examples disclosed or the exact construction and operation shown and described. Rather, all suitable modifications and equivalents may be resorted to, falling within the scope of the invention. For example, the n-doped and the p-doped group III-V nitride layers can be switched in position, that is, the p-doped group III-V nitride layer can be positioned underneath the quantum-well layer and n-doped group III-V nitride layer can be positioned on the quantum-well layer. The disclosed LED structure may be suitable for emitting green, blue, and emissions of other colored lights. In another example, a (111) silicon wafer can be used as a substrate to allow trenches having (100) sloped surfaces to form in the substrate.

Moreover, the sloped protrusion surface can be at an angle between 20 degrees and 80 degrees, or as a more specific example, between 50 degrees and 60 degrees, relative to the upper surface of the substrate. The emission surfaces on a protrusion in the disclosed light emitting device can be more than 1.2, or 1.4, or 1.6 times of the base area of the protrusion. The large emission surface areas in the described light emitting devices allow the disclosed light emitting device can thus generate much higher light emission intensity than conventional LED devices.

The disclosed systems and methods are compatible with a wide range of applications such as laser diodes, blue/UV LEDs, Hall-effect sensors, switches, UV detectors, micro electrical mechanical systems (MEMS), and RF power transistors. The disclosed devices may include additional components for various applications. A laser diode based on the disclosed device can include reflective surfaces or mirror surfaces for producing lasing light. For lighting applications, the disclosed system may include additional reflectors and diffusers.

What is claimed is:

1. A light emitting device, comprising:
   a pyramid-shaped conductive substrate having a lower surface and a pyramid-shaped upper surface protruding from the lower surface with an angle between the lower surface and a side of the pyramid-shaped upper surface of about 125 degrees; and
   light emission layers disposed over the pyramid-shaped upper surface, wherein the light emission layers are configured to emit light when an electric field is applied across the light emission layers, and wherein the light emissions layers over the pyramid-shaped upper surface are fully exposed to allow light emission to the outside.

2. The light emitting device of claim 1, wherein the conductive material includes a metallic material or a conducting polymer.

3. The light emitting device of claim 1, wherein the light emission layers comprises at least one quantum well formed by Group III-V compounds.

4. The light emitting device of claim 3, wherein the quantum well is formed by:
a first III-V nitride layer;
a quantum-well layer on the first III-V nitride layer; and
a second III-V nitride layer on the quantum well layer.

5. The light emitting device of claim 1, further comprising a reflective layer formed between the conductive substrate and the light emission layers.

6. The light emitting device of claim 5, wherein the reflective layer comprises aluminum.

7. The light emitting device of claim 1, further comprising a transparent conductive layer formed over the light emission layers, wherein the electric field across the light emission layers is produced by a voltage applied between the transparent conductive layer and the conductive substrate.

8. The light emitting device of claim 7, further comprising an electrode layer in electric connection with the transparent conductive layer.

* * * * *